(12) United States Patent
Goto

(10) Patent No.: US 9,082,732 B2
(45) Date of Patent: Jul. 14, 2015

(54) ORGANIC EL DISPLAY PANEL AND METHOD FOR MANUFACTURING SAME

(71) Applicant: JOLED INC., Tokyo (JP)

(72) Inventor: Masashi Goto, Hyogo (JP)

(73) Assignee: JOLED INC., Tokyo (JP)

(\*) Notice: Subject to any disclaimer, the term of this patent is extended or adjusted under 35 U.S.C. 154(b) by 0 days.

(21) Appl. No.: 14/365,698

(22) PCT Filed: Dec. 27, 2012

(86) PCT No.: PCT/JP2012/008414
§ 371 (c)(1),
(2) Date: Jun. 16, 2014

(87) PCT Pub. No.: WO2013/099276
PCT Pub. Date: Jul. 4, 2013

(65) Prior Publication Data
US 2015/0001514 A1    Jan. 1, 2015

(30) Foreign Application Priority Data
Dec. 28, 2011 (JP) .................................. 2011-287328

(51) Int. Cl.
*H01L 51/00* (2006.01)
*H01L 27/32* (2006.01)
(Continued)

(52) U.S. Cl.
CPC ........ *H01L 27/3246* (2013.01); *H01L 27/3218* (2013.01); *H01L 51/0005* (2013.01); *H01L 51/5243* (2013.01); *H01L 51/56* (2013.01); *H01L 27/3211* (2013.01); *H01L 51/5012* (2013.01); *H01L 2227/323* (2013.01)

(58) Field of Classification Search
USPC .......................................................... 257/40
See application file for complete search history.

(56) References Cited

U.S. PATENT DOCUMENTS 5,443,922 A    8/1995 Nishizaki et al.
7,932,109 B2   4/2011 Hayata et al.
(Continued)

FOREIGN PATENT DOCUMENTS

JP    05-163488    6/1993
JP    2003-241683  8/2003
(Continued)

OTHER PUBLICATIONS

International Search Report (ISR) in International Patent Application No. PCT/JP2012/008414, dated Apr. 2, 2013.

*Primary Examiner* — Thao P Le
(74) *Attorney, Agent, or Firm* — Greenblum & Bernstein, P.L.C.

(57) ABSTRACT

An organic EL display panel including organic light-emission layers formed according to an inkjet method and suppressing decrease in image display quality caused by stripe unevennesses, and a method of manufacturing the same. In a bank layer forming process, openings belonging to a first array and openings belonging to a second array that is adjacent to the first in a row direction are offset with respect to one another in the column direction. In an organic light-emission layer forming process, a head unit is caused to move in a row direction, and nozzles used are switched between the first and second arrays. When a nozzle ejecting an erroneous ink volume is switched between being used and not being used, continuous forming of organic light-emission layers having a same, erroneous film thickness in the row direction is prevented. Thus, unevenness in luminance is suppressed.

28 Claims, 19 Drawing Sheets

(51) Int. Cl.
*H01L 51/52* (2006.01)
*H01L 51/56* (2006.01)
*H01L 51/50* (2006.01)

(56) References Cited

U.S. PATENT DOCUMENTS

| | | | |
|---|---|---|---|
| 8,435,093 | B2 | 5/2013 | Takeuchi |
| 8,648,337 | B2 * | 2/2014 | Hsieh ............................ 257/40 |
| 2003/0146710 | A1 | 8/2003 | Nakanishi |
| 2013/0092918 | A1 | 4/2013 | Okumoto et al. |
| 2013/0277663 | A1 | 10/2013 | Nanno et al. |
| 2013/0285032 | A1 | 10/2013 | Nanno et al. |
| 2013/0292667 | A1 | 11/2013 | Nanno et al. |
| 2014/0159009 | A1 * | 6/2014 | Song et al. ...................... 257/40 |
| 2014/0159016 | A1 * | 6/2014 | Song et al. ...................... 257/40 |
| 2014/0159018 | A1 * | 6/2014 | Song et al. ...................... 257/40 |

FOREIGN PATENT DOCUMENTS

| | | |
|---|---|---|
| JP | 2004-014321 | 1/2004 |
| JP | 2005-334781 | 12/2005 |
| JP | 2008-249781 | 10/2008 |

* cited by examiner

Mode A

Mode B ($n_4$ and $n_{10}$ switched on/off)

($n_4$ and $n_{10}$ switched on/off)

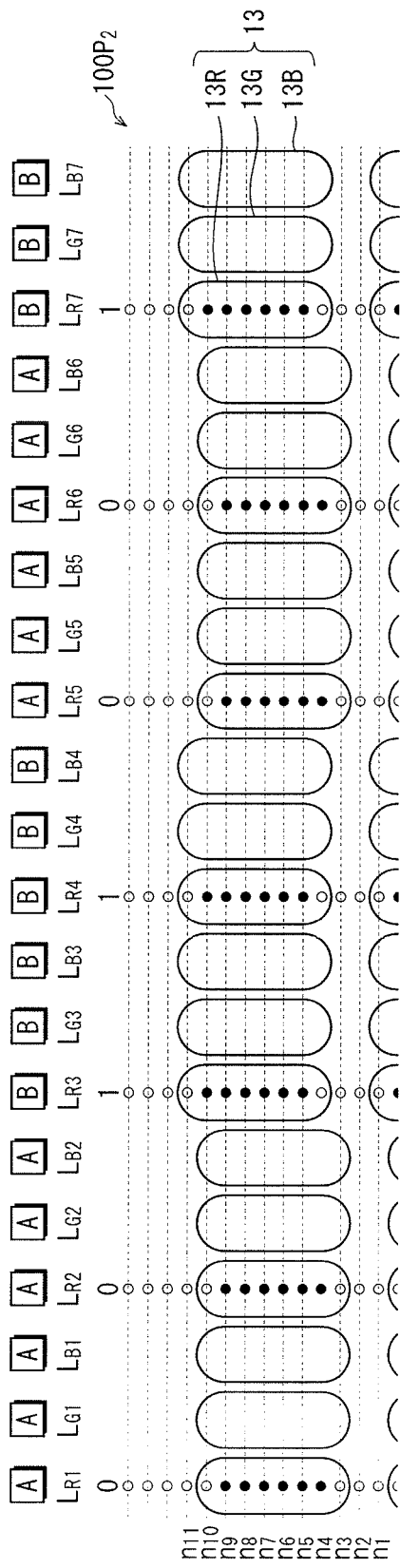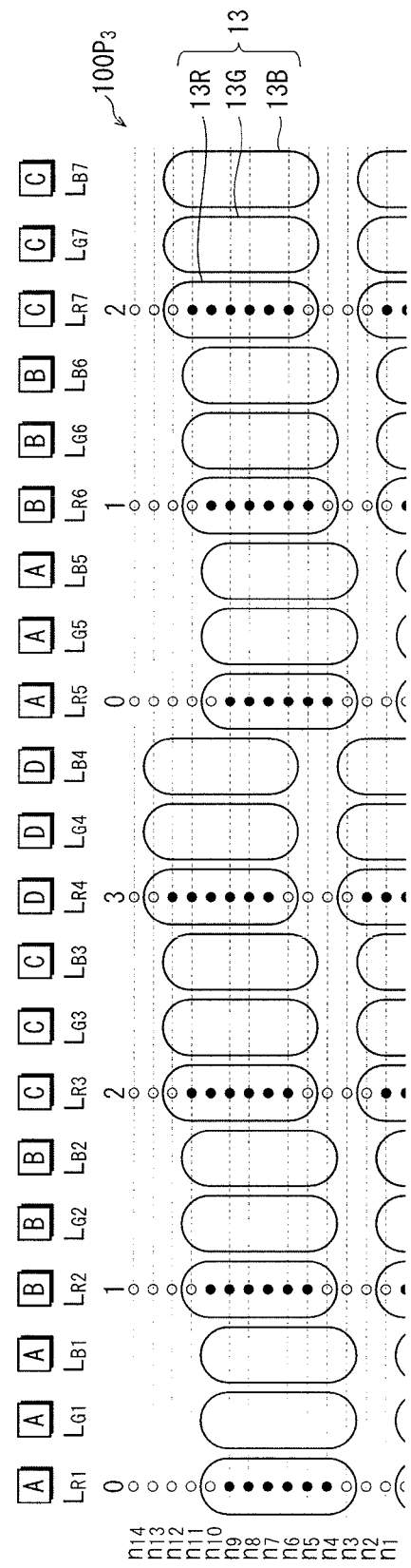

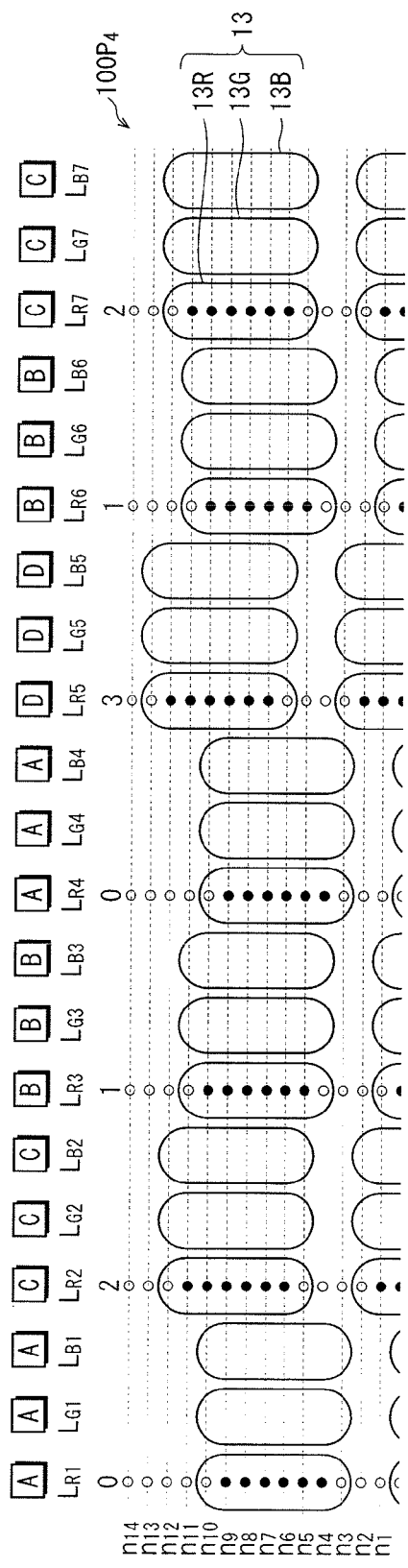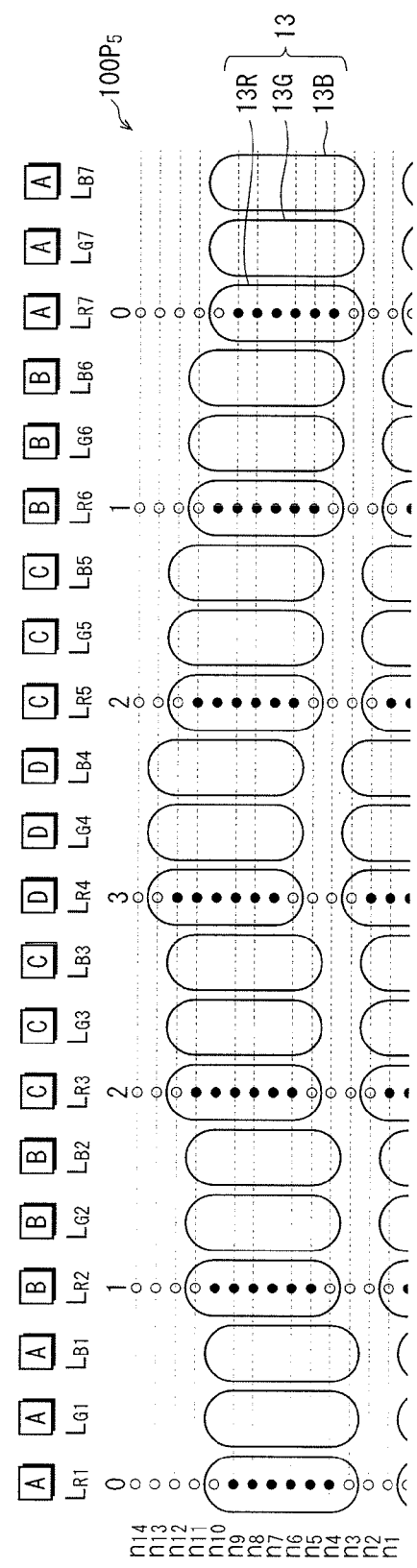

Conventional example (no offset)

Application example 1
(offset amount = 1 nozzle pitch)

Application example 2
(offset amount = 2 nozzle pitches)

Application example 3
(offset amount = 3 nozzle pitches)

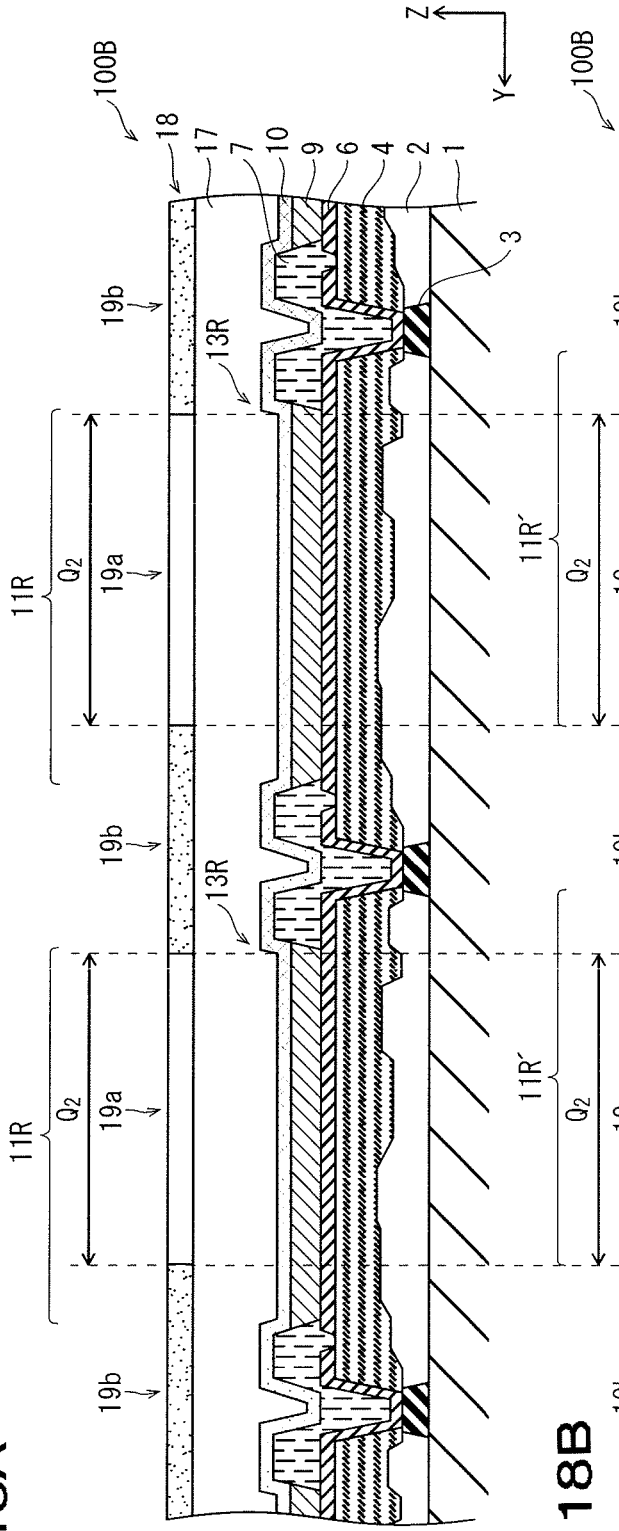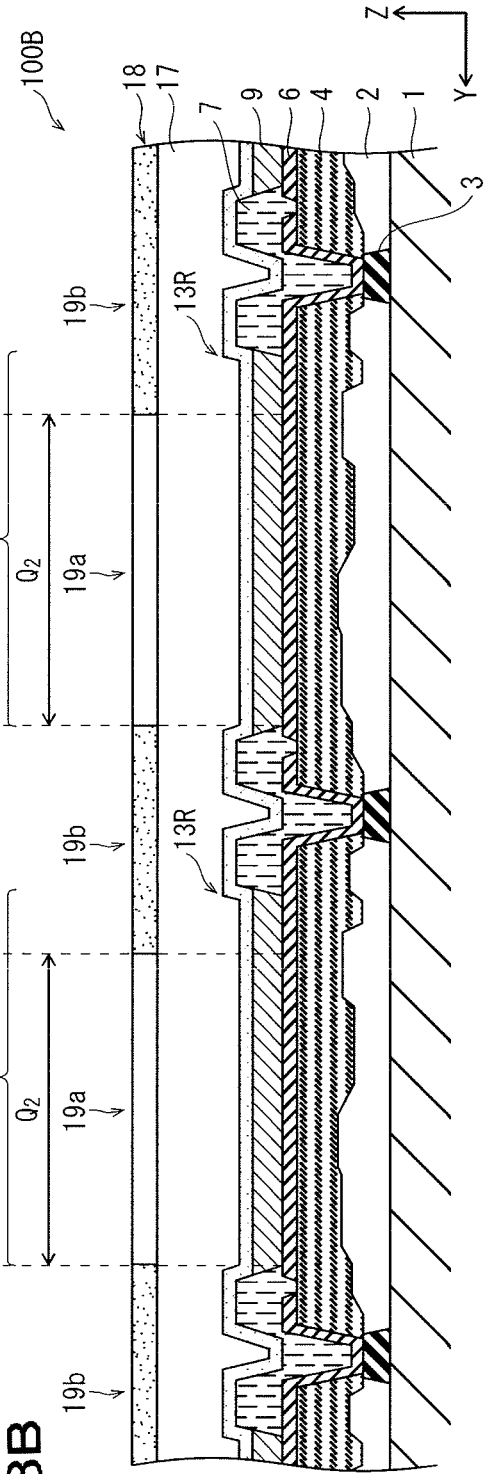

ORGANIC EL DISPLAY PANEL AND METHOD FOR MANUFACTURING SAME

TECHNICAL FIELD

The present disclosure relates to an organic EL display panel and a method for manufacturing the same. Organic EL display panels utilize organic electric-field light-emission elements (hereinafter referred to as "organic EL elements"), which is a type of electric light-emission element. In particular, the present disclosure relates to a technology for ink application using an inkjet head.

DESCRIPTION OF THE RELATED ART

An organic EL element is a current-driven light-emission element. An organic EL element typically has a basic structure where an organic light-emission layer is disposed between an anode and a cathode, which compose an electrode pair. When the organic EL element is driven, voltage is applied between the anode and cathode. Thus, holes are injected to the organic light-emission layer from the anode side, and electrons are injected to the organic light-emission layer from the cathode side. The holes and electrons recombine in the organic light-emission layer, bringing about an electric-field light-emission phenomenon. The organic EL element makes use of this electric-field light-emission phenomenon. Organic EL elements achieve high visibility, owing from their self-luminescent property. In addition, organic EL elements also achieve high shock resistance, owing to their fully solid-state structure.

An application-type organic EL element is known as one type of organic EL element. An application-type organic EL element is characterized for having an organic light-emission layer, a hole injection layer, etc., each formed by application, according to a wet process (ink application process), of ink containing high molecular material or low molecular material with excellent thin-film forming property, and the subsequent drying of the ink so applied. Further, development is in progress of an organic EL display panel including a plurality of such application-type organic EL elements disposed in both a row direction and a column direction above a substrate. Here, one example of a wet process as referred to in the present disclosure is the inkjet method.

For example, according to the inkjet method, a manufacture intermediate body (refers to a state of an organic EL display panel in the midst of manufacturing thereof, hereinafter also referred to as "an application target substrate") is placed on a table, and an inkjet head is caused to sweep over and across the application target substrate. Further, the inkjet head is caused to eject, from a plurality of nozzles provided thereto, liquid droplets of ink (hereinafter also referred to as "ink liquid droplets") with respect to openings disposed in the application target substrate (refer to Patent Literature 1). Here, the ink contains, for example, at least a solvent and one of an organic light-emission material and a hole injection material. Further, the openings are partitioned from one another by a bank layer, and each of the openings is an area where an organic EL element is later to be formed. As for the method for driving an inkjet head, methods such as the piezo method are known, for example. When an inkjet head is driven according to the piezo method, ink ejection is controlled by using piezoelectric elements.

FIG. 19B is a partially-enlarged diagram illustrating the positional relationship between an application target substrate 100PX and an inkjet head 30 during a conventional ink application process. In FIG. 19B, openings 13R, 13G, 13B are illustrated. In the application target substrate 100PX, multiple sets of openings, each of which composed of the openings 13R, 13G, 13B disposed in the stated order, are disposed continuously adjacent to one another along a row direction. Note that in the present disclosure, unless otherwise stated, the row direction corresponds to the X direction in the drawings. Ink liquid droplets containing organic light-emission material of the color red (R), ink liquid droplets containing organic light-emission material of the color green (G), and ink liquid droplets containing organic light-emission material of the color blue (B) are to be ejected with respect to the opening 13R, the opening 13G, and the opening 13B, respectively. The inkjet head 30 has a plurality of nozzles disposed in line. In FIG. 19B, a group of continuously-adjacent nozzles indicated by nozzle numbers $n_1$-$n_{11}$ is illustrated. In FIG. 19B, nozzles that eject ink are indicated by filled circles, whereas nozzles that do not eject ink are indicated by open circles. As such, FIG. 19B illustrates a situation where the nozzles $n_4$ through $n_9$ are used for ink application.

In the ink application process, the inkjet head 30 is caused to sweep over and across the application target substrate 100PX in the row direction, and thus, ink application is performed in the row direction, as illustrated in FIG. 19B. Further, in the ink application process for one of the colors R, G, and B, a group of nozzles (for example, the group of nozzles composed of the nozzles $n_4$ through $n_9$) ejects ink with respect to openings of the corresponding color (the openings 13R, 13G, or 13B) belonging to corresponding ones of column-direction arrays of openings $L_{R1}$, $L_{G1}$, $L_{B1}$, and so on (Note that in the present disclosure, unless otherwise stated, the column direction corresponds to the Y direction in the drawings). Here, when performing the ink application process with respect to the application target substrate 100PX, which includes a plurality of openings disposed in both the row direction and the column direction, when a given nozzle group is assigned to one opening among the plurality of openings disposed in the column direction, the same nozzle group is assigned to openings belonging to the same row as the one opening.

FIG. 19C is a partial cross-sectional diagram of an organic EL display panel 100X having been manufactured, taken along the Y direction in FIG. 19B. FIG. 19C illustrates three organic EL elements 11Ra, 11Rb, 11Rc, each including: a substrate 1; a TFT layer 2; a power-supply electrode 3; and a planarizing film 4. The organic EL elements 11Ra, 11Rb, 11Rc each further include: an electrode pair (a first electrode 6 and a second electrode 10); and an organic light-emission layer 9 (an organic light-emission layer of the color R in FIG. 19C) disposed between the electrode pair. The organic EL elements 11Ra, 11Rb, 11Rc are formed inside openings 13R belonging to the column-direction arrays $L_{R1}$, $L_{R2}$, $L_{R3}$, $L_{R4}$, and so on illustrated in FIG. 19B.

In an organic EL panel, it is important that organic EL elements included therein have uniform characteristics. As such, the same layer (the organic light-emission layer, the hole injection layers, etc.,) is to be provided with the same film thickness in each of the organic EL elements, preferably. To make this possible, preferably, the same amount of ink is to be ejected with respect to each opening in the ink application process. Due to this, a measure is taken, for example, of equalizing the volume of ink ejected from each nozzle (hereafter referred to as an "ink volume") when performing configuration of an inkjet head to equalize the ink volume ejected with respect to each opening.

CITATION LIST

Patent Literature

[Patent Literature 1]
Japanese Patent Application Publication No. 2003-241683
[Patent Literature 2]
Japanese Patent Application Publication No. 2004-014321
[Patent Literature 3]
Japanese Patent Application Publication No. 2008-249781

SUMMARY

Technical Problem

FIG. 19A is a front-view diagram of the organic EL display panel 100X, which is included in a conventional organic EL display device. When the conventional organic EL display device is driven, unevenness in luminance may become visible on a screen of the organic EL display panel 100X, by appearing on the screen in the form of one or more stripes extending in the row direction. Such unevenness in luminance, appearing in the form of stripes on a screen, is hereinafter referred to as stripe unevennesses. In the following, description is provided on why and how such stripe unevennesses appear, with reference to FIGS. 19B and 19C.

In the manufacturing of an inkjet head, the precision of the processing for forming the liquid chambers, nozzles, etc., provided inside the inkjet head may vary. In addition, an ink flow amount of an inkjet head may change with time, due to ink components adhering to the inside of liquid chambers, nozzles, etc., as the inkjet head continues to be used. Such situations result in nozzles of an inkjet head having ununiform characteristics in terms of the ejection of ink liquid droplets. For example, each of the nozzles $n_4$ through $n_9$ illustrated in FIG. 19B may eject different ink volumes.

Here, a situation is considered where the group of nozzles $n_4$ through $n_9$ includes a nozzle ejecting a relatively great, erroneous ink volume. Further, the following describes a case where the group of nozzles $n_4$ through $n_9$ is used to form the organic light-emission layers 9 illustrated in FIG. 19C. In this case, the same ink volume is ejected by the nozzles $n_4$ through $n_9$ with respect to each of the openings 13R belonging to the column-direction arrays $L_{R1}$, $L_{R2}$, $L_{R3}$, $L_{R4}$, and so on, and this ink volume is erroneous. Accordingly, in such a case, a film thickness $D_2$ of the organic light-emission layers 9 in the organic EL elements 11Rb, which are disposed in one row, may erroneously differ from a film thickness $D_1$ of the organic light-emission elements 9 in the organic EL element 11Ra, which are disposed in another row, and a film thickness $D_3$ of the organic light-emission elements 9 in the organic EL elements 11Rc, which are disposed in yet another row. More specifically, in the above-described case, the film thickness $D_2$ is greater than the film thicknesses $D_1$ and $D_3$.

Thus, in the above-described case, the organic EL elements 11Rb, each of which including an organic light-emission layer 9 having a relatively great, erroneous film thickness, are disposed continuously adjacent to one another in one same row in the organic EL display panel 100X. This results in a stripe unevenness, which is caused by the erroneous film thickness of the organic light-emission layers 9 in the organic EL elements 11Rb, appearing on the screen of the organic EL display panel 100X, as illustrated in FIG. 19A. Such a stripe unevenness is one cause of a decrease in the image display quality of an organic EL display panel, since a plurality of such stripe unevennesses may appear and thus stand out on the screen.

In view of the above, the present disclosure provides an organic EL display panel that includes organic light-emission layers formed according to the inkjet method and that effectively suppresses a decrease in image display quality brought about by stripe unevennesses, and a method of manufacturing such an organic EL display panel.

Solution to Problem

One aspect of the present disclosure is a method of manufacturing an organic EL display panel, including: forming, above a substrate, a plurality of first electrodes in both a row direction and a column direction of a surface of the substrate; forming, above the substrate, a bank layer having openings that are in one-to-one correspondence with the first electrodes, the openings each exposing at least a part of a corresponding one of the first electrodes; forming organic light-emission layers by using an inkjet head having a plurality of nozzles, by (i) moving at least one of the inkjet head and the substrate in the row direction and thereby causing relative movement of the inkjet head and the substrate with respect to one another, and (ii) when each of the nozzles arrives above one of the openings as a result of the relative movement, causing said each of the nozzles to eject an ink liquid droplet with respect to said one of the openings so that the ink liquid droplet arrives inside said one of the openings; and forming a second electrode above the organic light-emission layers. In the method, the bank layer is formed such that, among the openings, a first column-direction array of openings and a second column-direction array of openings are offset with respect to one another in the column direction by an offset amount that is no greater than 50% of a predetermined pitch at which the openings are disposed in the column direction, and the organic light-emission layers are formed by using some of the nozzles as a first group of nozzles and using some of the nozzles as a second group of nozzles, and by switching between the first group of nozzles and the second group of nozzles, the first group of nozzles used when the inkjet head arrives above the first column-direction array of openings and ejecting ink liquid droplets with respect to the first column-direction array of openings, the second group of nozzles used when the inkjet head arrives above the second column-direction array of openings and ejecting ink liquid droplets with respect to the second column-direction array of openings.

Advantageous Effects of Invention

In the method according to one aspect of the present disclosure, the bank layer is formed such that a first column-direction array of openings and a second column-direction array of openings are offset with respect to one another in the column direction by an offset amount that is no greater than 50% of a predetermined pitch at which the openings are disposed in the column direction. Due to this, when moving at least one of the inkjet head and the substrate in the row direction and thereby causing relative movement of the inkjet head and the substrate with respect to one another in the forming of the organic light-emission layers, a group of nozzles of the inkjet head used for ejecting ink with respect to openings in one row is switched between the first group of nozzles and the second group of nozzles, according to whether the inkjet head is above the first column-direction array of openings or the second column-direction array of openings. Accordingly, when a nozzle ejecting an erroneous amount of ink is switched between an ink ejection state and an ink non-ejection state due to switching between the first group of nozzles and the second group of nozzles being performed as described above, a situation where the same, erroneous amount of ink is continuously ejected with respect to each opening in one row is avoided. Thus, when a nozzle ejecting an erroneous amount of ink is switched, it is ensured that the ink volume ejected with respect to an opening belonging to the first column-direction array and the ink volume ejected with respect to an opening belonging to the second column-direction array differ from one another.

Thus, in an organic EL display panel manufactured according to the method pertaining to one aspect of the present disclosure, the risk is reduced of organic light-emission layers having a same, erroneous film thickness being formed continuously in the row direction. Thus, the present disclosure provides an organic EL display panel that includes organic light-emission layers formed according to the inkjet method and that effectively suppresses a decrease in image display quality brought about by stripe unevennesses, and a method of manufacturing such an organic EL display panel.

BRIEF DESCRIPTION OF DRAWINGS

FIG. 11A is an enlarged front-view diagram of an application target substrate $100P_2$ for explaining an organic light-emission layer forming process pertaining to embodiment 3, and FIG. 11B is an enlarged front-view diagram of an application target substrate $100P_3$ for explaining an organic light-emission layer forming process pertaining to embodiment 4.

FIG. 12A is an enlarged front-view diagram of an application target substrate $100P_4$ for explaining an organic light-emission layer forming process pertaining to embodiment 5, and FIG. 12B is an enlarged front-view diagram of an application target substrate $100P_5$ for explaining an organic light-emission layer forming process pertaining to embodiment 6.

FIG. 14 illustrates the ink volume unevenness between openings in a column direction).

FIG. 18A is a partial cross-sectional diagram illustrating the structure of an area including an organic EL element 11R in the organic EL display panel pertaining to embodiment 8, and FIG. 18B is a partial cross-sectional diagram illustrating the structure of an area including an organic EL element 11R' in the organic EL display panel pertaining to embodiment 8.

DETAILED DESCRIPTION

Aspects of Invention

Figure 1A:
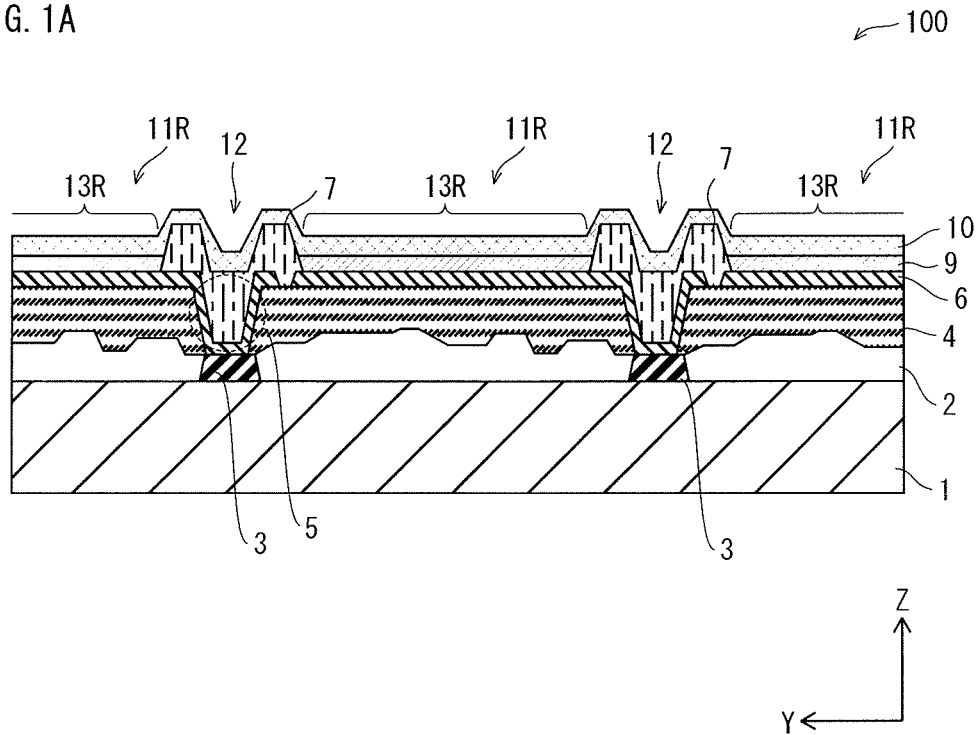
FIG. 1A is a schematic cross-sectional diagram illustrating the structure of an organic EL display panel 100 pertaining to embodiment 1.

One aspect of the present disclosure is a method of manufacturing an organic EL display panel, including: forming, above a substrate, a plurality of first electrodes in both a row direction and a column direction of a surface of the substrate; forming, above the substrate, a bank layer having openings that are in one-to-one correspondence with the first electrodes, the openings each exposing at least a part of a corresponding one of the first electrodes; forming organic light-emission layers by using an inkjet head having a plurality of nozzles, by (i) moving at least one of the inkjet head and the substrate in the row direction and thereby causing relative movement of the inkjet head and the substrate with respect to one another, and (ii) when each of the nozzles arrives above one of the openings as a result of the relative movement, causing said each of the nozzles to eject an ink liquid droplet with respect to said one of the openings so that the ink liquid droplet arrives inside said one of the openings; and forming a second electrode above the organic light-emission layers. In the method, the bank layer is formed such that, among the openings, a first column-direction array of openings and a second column-direction array of openings are offset with respect to one another in the column direction by an offset amount that is no greater than 50% of a predetermined pitch at which the openings are disposed in the column direction, and the organic light-emission layers are formed by using some of the nozzles as a first group of nozzles and using some of the nozzles as a second group of nozzles, and by switching between the first group of nozzles and the second group of nozzles, the first group of nozzles used when the inkjet head arrives above the first column-direction array of openings and ejecting ink liquid droplets with respect to the first column-direction array of openings, the second group of nozzles used when the inkjet head arrives above the second column-direction array of openings and ejecting ink liquid droplets with respect to the second column-direction array of openings.

In the method according to one aspect of the present disclosure, the bank layer is formed such that a first column-direction array of openings and a second column-direction array of openings are offset with respect to one another in the column direction by an offset amount that is no greater than 50% of a predetermined pitch at which the openings are disposed in the column direction. Due to this, when causing relative movement of the inkjet head and the substrate with respect to one another, a group of nozzles of the inkjet head used for ejecting ink with respect to openings in one row is switched between the first group of nozzles, which corresponds to the first column-direction array of openings, and the second group of nozzles, which corresponds to the second column-direction array of openings. Accordingly, when a nozzle ejecting an erroneous amount of ink is switched between an ink ejection state and an ink non-ejection state due to switching between the first group of nozzles and the second group of nozzles being performed as described above, a situation where the same, erroneous amount of ink is continuously ejected with respect to each opening in one row is avoided. Thus, when a nozzle ejecting an erroneous amount of ink is switched, it is ensured that the ink volume ejected with respect to an opening belonging to the first column-direction array and the ink volume ejected with respect to an opening belonging to the second column-direction array differ from one another.

In the method pertaining to one aspect of the present disclosure, the offset amount may be no smaller than 10% of the predetermined pitch.

In the method pertaining to one aspect of the present disclosure, the forming of the organic light-emission layers may be performed for each of three light-emission colors, wherein (i) an ink liquid droplet of a corresponding one of the three light-emission colors is ejected inside a different one of openings that are adjacent in the row direction, whereby a first organic light-emission layer, a second organic light-emission layer, and a third organic light-emission layer, each having a different one of the three light-emission colors, are formed, and (ii) one of the first, second, and third organic light-emission layers is formed with respect to each opening belonging to the first column-direction array of openings, and the same one of the first, second, and third organic light-emission layers is formed with respect to each opening belonging to the second column-direction array of openings.

In the method pertaining to one aspect of the present disclosure, the first organic light-emission layer, the second organic light-emission layer, and the third organic light-emission layer may be formed in the stated order with respect to a set of three openings adjacent in the row direction, and the bank layer may be formed such that (i) the first column-direction array of openings and the second column-direction array of openings are formed for each of the first, second, and third organic light-emission layers, and (ii) the three openings composing the set of three openings, with respect to which the first, second, and third organic light-emission layers are to be formed in the stated order, are not offset in the column direction and thus in alignment with respect to one another in the column direction.

In the method pertaining to one aspect of the present disclosure, the bank layer may be formed such that the set of three openings is disposed in plurality in the row direction and such that the bank layer has, in the row direction, a unit composed of no smaller than two and no greater than one hundred continuously-adjacent sets of three openings.

In the method pertaining to one aspect of the present disclosure, the bank layer may be formed such that, in the row direction, the first column-direction array of openings and the second column-direction array of openings are adjacent to each other.

In the method pertaining to one aspect of the present disclosure, the bank layer may be formed such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a zigzag pattern.

In the method pertaining to one aspect of the present disclosure, the bank layer may be formed such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a staircase pattern.

In the method pertaining to one aspect of the present disclosure, the bank layer may be formed such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a random pattern.

In the method pertaining to one aspect of the present disclosure, in each of the first group of nozzles and the second group of nozzles, the number of nozzles corresponding to a single opening may be no greater than ten.

In the method pertaining to one aspect of the present disclosure, in the inkjet head, the nozzles may be disposed along one direction in line, and the organic light-emission layers may be formed by causing said at least one of the inkjet head and the substrate to move in the row direction while forming an angle between said one direction and the row direction.

The method pertaining to one aspect of the present disclosure may further include forming a pixel defining layer that is made of an electrically-insulative material in each of the openings, the forming of the pixel defining layers performed at least before the forming of the organic light-emission layers, and in the method, in each of the openings, the pixel defining layer may partially overlap with a corresponding one of the first electrodes so as to define a light-emission region of said each of the openings, and the pixel defining layer may be formed at one or both of two column-direction end portions of said each of the openings, the pixel defining layer may be either (i) a first pixel defining layer formed in each opening belonging to the first column-direction array of openings and defining a first light-emission region, which is a light-emission region in said each opening belonging to the first column-direction array of openings, or (ii) a second pixel defining layer formed in each opening belonging to the second column-direction array of openings and defining a second light-emission region, which is a light-emission region in said each opening belonging to the second column-direction array of openings, and the pixel defining layer may be formed such that a first light-emission region and a second light-emission region in a same row have a same column-direction position.

In the method pertaining to one aspect of the present disclosure, the pixel defining layer may be formed such that, in the column direction, each of a length of the first light-emission region and a length of the second light-emission region is no shorter than 30% of a length of each of the openings.

The method pertaining to one aspect of the present disclosure may further include forming a sealing layer above the second electrode; and disposing a second substrate above the sealing layer, and in the method, the second substrate may have light-transmissive areas that face the openings in one-to-one correspondence, and a black matrix surrounding the light-transmissive areas, and the light-transmissive areas may be disposed such that a first light-emission region and a second light-emission region in a same row have a same column-direction position, the first light-emission region formed in each opening belonging to the first column-direction array of openings and the second light-emission region formed in each opening belonging to the second column-direction array of openings.

In the method pertaining to one aspect of the present disclosure, the light-transmissive areas may be disposed such that, in the column direction, each of a length of the first light-emission region and a length of the second light-emission region is no shorter than 30% of a length of each of the openings.

Another aspect of the present invention is an organic EL display panel including: a substrate; a TFT layer disposed above the substrate; a plurality of first electrodes disposed above the TFT layer in both a row direction and a column direction; a bank layer having a plurality of openings formed therein in both the row direction and the column direction, the openings each exposing a corresponding one of the first electrodes; a plurality of organic light-emission layers each disposed inside a corresponding one of the openings; and a second electrode disposed above the organic light-emission layers. In the organic EL display panel pertaining to one aspect of the present disclosure, the openings include a first column-direction array of openings and a second column-direction array of openings, the first-column direction array of openings and the second column-direction array of openings being offset with respect to one another in the column direction by an offset amount that is no greater than 50% of a predetermined pitch at which the openings are disposed in the column direction.

In the organic EL display panel pertaining to one aspect of the present disclosure, the offset amount may be no smaller than 10% of the predetermined pitch.

In the organic EL display panel pertaining to one aspect of the present disclosure, a first organic light-emission layer, a second organic light-emission layer, and a third organic light-emission layer, each having a different one of three light-emission colors, may be formed with respect to openings that are adjacent in the row direction, the forming of each of the first, second, and third organic light-emission layers being performed by ejecting an ink liquid droplet of a corresponding one of the three light-emission colors inside a different one of the openings that are adjacent in the row direction, and one of the first, second, and third organic light-emission layers may be formed with respect to each opening belonging to the first column-direction array of openings, and the same one of the first, second, and third organic light-emission layers may be formed with respect to each opening belonging to the second column-direction array of openings.

In the organic EL display panel pertaining to one aspect of the present disclosure, the first organic light-emission layer, the second organic light-emission layer, and the third organic light-emission layer may be formed in the stated order with respect to a set of three openings adjacent in the row direction, and in the bank layer, (i) the first column-direction array of openings and the second column-direction array of openings may be disposed for each of the first, second, and third organic light-emission layers, and (ii) the three openings composing the set of three openings, with respect to which the first, second, and third organic light-emission layers are to be disposed in the stated order, may not be offset in the column direction and thus may not in alignment with respect to one another in the column direction.

In the organic EL display panel pertaining to one aspect of the present disclosure, the bank layer may be such that the set of three openings is disposed in plurality in the row direction, and the bank layer has, in the row direction, a unit composed of no smaller than two and no greater than one hundred continuously-adjacent sets of three openings.

In the organic EL display panel pertaining to one aspect of the present disclosure, the bank layer may be such that, in the row direction, the first column-direction array of openings and the second column-direction array of openings are adjacent to each other.

In the organic EL display panel pertaining to one aspect of the present disclosure, the bank layer may be such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a zigzag pattern.

In the organic EL display panel pertaining to one aspect of the present disclosure, the bank layer may be such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a staircase pattern.

In the organic EL display panel pertaining to one aspect of the present disclosure, the bank layer may be such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a random pattern.

The organic EL display panel pertaining to one aspect of the present disclosure may further include: a pixel defining layer disposed in each of the openings such that in said each of the openings, the pixel defining layer partially overlaps with a corresponding one of the first electrodes so as to define a light-emission region of said each of the openings, and in the organic EL display panel, the pixel defining layer may be formed at one or both of two column-direction end portions of said each of the openings, the pixel defining layer may be either (i) a first pixel defining layer disposed in each opening belonging to the first column-direction array of openings and defining a first light-emission region, which is a light-emission region in said each opening belonging to the first column-direction array of openings, or (ii) a second pixel defining layer disposed in each opening belonging to the second column-direction array of openings and defining a second light-emission region, which is a light-emission region in said each opening belonging to the second column-direction array of openings, and the pixel defining layer may be formed such that a first light-emission region and a second light-emission region in a same row have a same column-direction position.

In the organic EL display panel pertaining to one aspect of the present disclosure, the pixel defining layer may be such that, in the column direction, each of a length of the first light-emission region and a length of the second light-emission region is no shorter than 30% of a length of each of the openings.

The organic EL display panel pertaining to one aspect of the present disclosure may further include: a sealing layer disposed above the second electrode; and a second substrate disposed above the sealing layer, and in the organic EL display panel, the second substrate may have light-transmissive areas that face the openings in one-to-one correspondence, and a black matrix surrounding the light-transmissive areas, and the light-transmissive areas may be disposed such that a first light-emission region and a second light-emission region in a same row have a same column-direction position, the first light-emission region formed in each opening belonging to the first column-direction array of openings and the second light-emission region formed in each opening belonging to the second column-direction array of openings.

In the organic EL display panel pertaining to one aspect of the present disclosure, the light-transmissive areas may be disposed such that, in the column direction, each of a length of the first light-emission region and a length of the second light-emission region is no shorter than 30% of a length of each of the openings.

Embodiment 1

(Structure of Organic EL Display Panel 100)

FIG. 1A is a schematic cross-sectional diagram illustrating the structure of an organic EL display panel 100 pertaining to embodiment 1. FIG. 1A illustrates the structure of three organic EL elements 11R of the same color R that are disposed adjacent to one another in the column direction in the organic EL display panel 100.

Each of the organic EL elements 11R includes a TFT substrate 1 (hereinafter referred to simply as the "substrate 1"); and layers on one main surface (in FIG. 1A, the upper one of the surfaces) of the TFT substrate 1, which include, in the order of layering: a TFT wiring part (a TFT layer 2); a planarizing film 4; a first electrode 6; an organic light-emission layer 9; and a second electrode (cathode) 10.

Figure 1B:
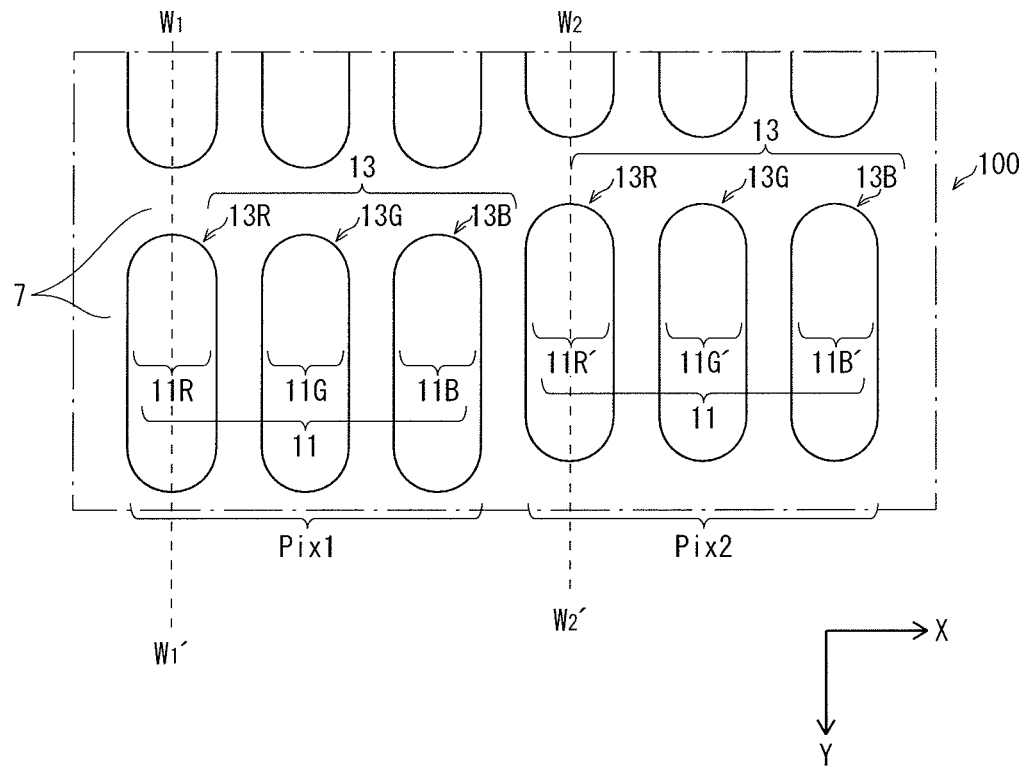
FIG. 1B is a partial front-view diagram illustrating a set of organic EL elements 11R, 11G, 11B, which corresponds to one pixel of the organic EL display panel 100.

Meanwhile, when viewed from a front side thereof (as illustrated in FIG. 1B, which is a partial front-view diagram of the organic EL display panel 100), the organic EL display panel 100 includes the organic EL element 11R, an organic EL element 11G, and an organic EL element 11B as subpixels (light-emission units). The organic EL element 11R, the organic EL element 11G, and the organic EL element 11B are formed with respect to an opening 13R, an opening 13G, and an opening 13B, respectively. The opening 13R, the opening 13G, and the opening 13B are disposed adjacent to one another in the row direction. Further, the organic EL element 11R, the organic EL element 11G, and the organic EL element 11B correspond to the colors R, G, and B, respectively. Thus, the organic EL elements 11R, 11G, 11B each have an organic light-emission layer 9 of a different light-emission color.

Each of the three organic EL elements 11R, 11G, 11B, which are adjacent to one another in one row, is one subpixel of the organic EL display panel 100. A set of three subpixels (the set of the three organic EL elements 11R, 11G, 11B) composes one pixel. FIG. 1B illustrates a first pixel $Pix_1$ and a second pixel $Pix_2$ that are adjacent to one another in the row direction. The second pixel $Pix_2$ is composed of a set of organic EL elements 11R', 11G', 11B'.

Meanwhile, in the column direction, the organic EL display panel 100 includes arrays of subpixels each composed of subpixels having the same one of the light-emission colors R, G, B, as illustrated in FIG. 1A.

As described up to this point, the organic EL display panel 100 includes a plurality of organic EL elements disposed in both the row direction and the column direction to form a matrix. Note that in the following, when there is no need to make a distinction between light-emission colors and pixels, the term "organic EL element 11" is used to simply refer to organic EL elements 11R, 11G, 11B, 11R', 11G', 11B', and the term "opening 13" is used to refer to the openings 13R, 13G, 13B.

Next, description is provided on the structural components of each organic EL element 11, one by one.

Above the first electrode 6, a bank layer 7 having an opening 13 is disposed (FIG. 1B). The opening 13R in the organic EL element 11R, which is illustrated in FIG. 1A, is one example of the opening 13. The opening 13 defines an area where an organic EL element is to be formed. Inside the opening 13, the organic light-emission layer 9 and the second electrode (cathode) 10 are disposed above the first electrode 6, in the stated order.

[Substrate 1]

The substrate 1 is the base portion of the organic EL display panel 100. For example, the substrate 1 is made of an electrically-insulative material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

[TFT Layer 2]

The TFT layer 2 is provided to each organic EL element 11 in the organic EL display panel 100 to drive the organic EL element 11 according to the active matrix method. The TFT layer 2 is made of a combination of an electrically-conductive material, a semiconductor material, and an electrically-insulative material.

[Planarizing Film 4]

The planarizing film 4 is an inter-layer insulating film made of an organic material having an excellent electrically-insulative property, and is provided to cover and thereby planarize a surface of the TFT layer 2. At an area between two openings 13 adjacent to one another in the column direction, a round hole (a contact hole 5) is formed in the planarizing film 4 (FIG. 1A). Each contact hole 5 is formed by penetrating the planarizing film 4 in a thickness direction (the Z direction in FIG. 1A). Inside the contact hole 5, the TFT layer 2 is electrically connected with the first electrode 6 via a power supply electrode 3.

[First Electrode 6]

The first electrode 6 is an anode, and together with the second electrode 10, composes an electrode pair. The first electrode 6 is made of an electrically-conductive material such as Ag, APC (an alloy of silver, palladium, and copper), ARA (an alloy of silver, rubidium, and gold), MoCr (an alloy of molybdenum and chromium), or NiCr (an alloy of nickel and chromium). When the organic EL element 11 is a top-emission type organic EL element, the first electrode 6 is to be made of light-reflective material. On the other hand, when the organic EL element 11 is a bottom-emission type organic EL element, the first electrode 6 is to be made of light-transmissive material. The first electrode 6 is disposed in plurality in both the row direction and the column direction above the substrate 1. Each of the first electrodes 6 is disposed at a position corresponding to that of one of the openings 13, each of which defining an area where an organic EL element is to be formed.

[Bank Layer 7]

The main purpose of providing the bank layer 7 is to partition an area where one organic EL element is to be formed from an area where another organic EL element is to be formed. The bank layer 7 is made of an electrically-insulative organic material (for example, acrylic resin, polyimide resin, or novolac-type phenolic resin), and is liquid-repellent at least at a surface thereof. The bank layer 7 can be adjusted to have a desired pattern. In the organic EL display panel 100 in particular, the bank layer 7 has a lattice pattern (i.e., a pixel bank structure). That is, in the organic EL display panel 100, the bank layer 7 is formed so as to have a plurality of openings 13, each of which separately defining an area where one organic EL element is to be formed, in both the row direction and the column direction. Further, cross sections of the bank layer 7 taken along an X-Y plane and a Y-Z plane have trapezoidal shapes. Note that the bank layer 7 has a concave portion 12 at an area thereof corresponding to the contact hole 5 (FIG. 1A). The concave portion 12 is formed by bank material falling into the inside of the contact hole 5 and shrinking.

FIG. 1B illustrates two pixel groups (a first pixel group including the first pixel $Pix_1$ and a second pixel group including the second pixel $Pix_2$) that are partitioned from one another by the bank layer 7 and are adjacent to one another in the row direction. The bank layer 7 has a first group of openings corresponding to the first pixel group and a second group of openings corresponding to the second pixel group. Each of the first and second groups of openings is composed of column-direction arrays of openings, each corresponding to a different one of the colors R, G, B. Further, the first group of openings and the second group of openings are disposed so as to be offset with respect to one another in the column direction. This positional relationship between the first group of openings and the second group of openings is illustrated in FIG. 1B, taking the first pixel $Pix_1$ and the second pixel $Pix_2$ as an example.

For example, as illustrated in FIG. 1B, a group of openings composed of openings 13R in a first column-direction array (extending along the line $W_1$-$W_1'$) and a group of openings composed of openings 13R in a second column-direction array (extending along the line $W_2$-$W_2'$) are offset with respect to one another in the column direction by an offset amount no smaller than 10% and no greater than 50% of the pitch at which openings are disposed in the column direction. As such, in embodiment 1, first column-direction arrays of openings in the first pixel group including the first pixel $Pix_1$, each of which corresponding to a different one of the colors R, G, B, and second column-direction arrays of openings in the second pixel group including the second pixel $Pix_2$, each of which corresponding to a different one of the colors R, G, B, are disposed so as to be offset with respect to one another in the column direction. Meanwhile, the bank layer 7 is formed such that, in a single pixel, the openings 13R, 13G, 13B are arranged at the same position in the column direction. The openings 13 are disposed in the bank layer 7 in such a positional arrangement to prevent stripe unevennesses which may, without such a positional arrangement, be formed when the organic EL display panel 100 is driven.

Note that the concave portions 12 are not illustrated in FIG. 1B for the sake of simplifying explanation.

Here, note that the column-direction offset amount between the first groups of openings in the first pixel group and the second groups of openings in the second pixel group may be any amount that is no greater than half the pitch at which openings are disposed in the column direction. Specifically, the offset amount is no smaller than 10% and no greater than 50% of the pitch at which openings are disposed in the column direction, preferably. This specific range is determined taking into account: (i) the number of nozzles of an inkjet head used to apply ink with respect to one opening in a typical organic light-emission layer forming process utilizing a wet process, which is approximately no greater than ten (six in embodiment 1); (ii) the need of maintaining the balance in terms of position between subpixels in one pixel.

[Organic Light-emission Layer 9]

The organic light-emission layer 9 is the light-emitting part of the organic EL element 11. The forming of organic light-emission layers 9 of different light-emission colors is performed such that organic light-emission layers 9 of color R, organic light-emission layers 9 of color G, and organic light-emission layers of color B are respectively formed inside the openings 13R, 13G, 13B, above the first electrode 6, in the stated order. The organic light-emission layer 9 contains a predetermined organic material. A conventional organic material may be used as the predetermined organic material. Examples of material usable for forming the organic light-emission layer 9 include: a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2,2'-bipyridine compound, complex of a Schiff base and a group three metal, metal complex of oxine, rare earth metal complex, etc., as recited in Japanese Patent Application Publication No. H5-163488.

[Second Electrode 10]

The second electrode 10 is a cathode. The second electrode 10 is made of an electrically-conductive material, such as ITO (indium tin oxide) or IZO (indium zinc oxide). When the organic EL element 11 is a top-emission type organic EL element, the second electrode 10 is to be made of a light-transmissive material. On the other hand, when the organic EL element 11 is a bottom-emission type organic EL element, the second electrode 10 is to be made of a light-reflective material.

[Other Structural Components]

Although not illustrated in FIGS. 1A and 1B, a conventional sealing layer is disposed above the second electrode 10. The sealing layer is made, for example, of a material such as SiN (silicon nitride) or SiON (silicon oxynitride), and has the function of suppressing degradation of the organic light-emission layers 9 that occurs when the organic light-emission layers 9 fall in contact with moisture, air, etc. When the organic EL elements 11 are top-emission type organic EL elements, the sealing layer is to be made of a light-transmissive material.

In addition, although not illustrated in FIGS. 1A and 1B, a color filter substrate having a black matrix and color filters may be provided to the organic EL display panel 100 so as to face the second electrode 10. When such a color filter substrate is provided, in plan view of the organic EL display panel 100, the black matrix partitions the organic EL elements 11 from one another, and the color filter layers face the organic EL elements 11 in one-to-one correspondence.

Further, although the organic light-emission layer 9 is disposed directly on the first electrode 6 in the organic EL display panel 100, one conventional functional layer (for example, a hole transport layer, a hole injection layer, a buffer layer, or the like) may be disposed between the first electrode 6 and the organic light-emission layer 9. Similarly, one conventional layer, such as an electron transport layer, an electron injection layer, or the like may be disposed between the organic light-emission layer 9 and the second electrode 10.

(Effects Achieved by Organic EL Display Panel 100)

As illustrated in FIG. 1B, in the organic EL display panel 100, the column-direction positions of the openings 13R, 13G, 13B in a first pixel group and the column-direction positions of the openings 13R, 13G, 13B in a second pixel group, which is adjacent to the first pixel group in the row direction, are offset with respect to one another in the column direction by a fixed offset amount.

Due to this, when forming the organic light-emission layers 9 of each of the colors R, G, B according to a wet process by causing the inkjet head 30 to move relatively in the row direction and to apply ink liquid droplets 8 with respect to openings 13 of the corresponding color (the openings 13R, 13G, or 13B) that are adjacent in one row, the group of nozzles 3030 that are used for applying ink with respect to the openings 13 is switched for each pixel in the row. Thus, even when one of the nozzles 3030 ejects an erroneous ink volume, if the nozzle ejecting an erroneous ink volume is switched between an ink ejection state and an ink non-ejection state as a result of the switching between nozzle groups, a situation is avoided where the same, erroneous ink volume is continuously ejected with respect to openings of the same color (the openings 13R, 13G, or 13B) in the same row. In other words, if the nozzle ejecting an erroneous ink volume is switched as described above, the ink volume ejected by nozzles 3030 with respect to openings of the same color (the openings 13R, the openings 13G, or the openings 13B) in the same row differs between two adjacent pixels.

Thus, in the organic EL display panel 100, the risk is reduced of organic light-emission layers 9 having a same, erroneous film thickness being formed continuously in the row direction. As such, the risk of stripe unevennesses appearing when the organic EL display panel 100 is driven is suppressed, and the organic EL display panel 100 achieves excellent image display quality.

(Overall Method of Manufacturing Organic EL Display Panel 100)

In the following, first, description is provided on an example of an overall method of manufacturing the organic EL display panel 100, with reference to FIGS. 2A through 2D, FIG. 6, FIGS. 7A and 7B, FIG. 8, and FIGS. 9A and 9B. Subsequently, detailed description is provided on the organic light-emission layer forming process.

Figure 2A:
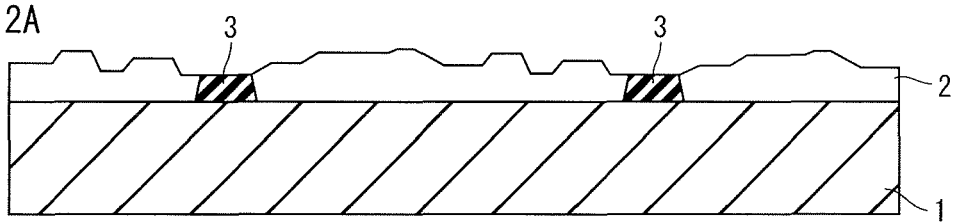
FIGS. 2A through 2D each illustrate a process in the manufacturing of the organic EL display panel 100.

First, the substrate 1 is prepared and is placed inside a chamber of a sputter film deposition device. Then, a predetermined sputtering gas is introduced into the chamber. In this state, an electrically-conductive material is sputtered onto the substrate 1 via a pattern mask. Here, the sputtering is performed, for example, according to a reactive sputtering method. Thus, the TFT layers 2 and the power supply electrodes 3 are each formed (FIG. 2A). Here, depending upon the positional arrangement of the openings 13 to be formed in the bank layer 7 in a later-performed bank layer forming process, the positional arrangement of the TFT layers 2 and the power supply electrodes 3 may be preemptively adjusted, preferably. In such a case, when performing film deposition according to the reactive sputtering method, care is to be taken such that the TFT layers 2 and the power supply electrodes 3 are each formed in a predetermined pattern and at predetermined positions.

Figure 2B:
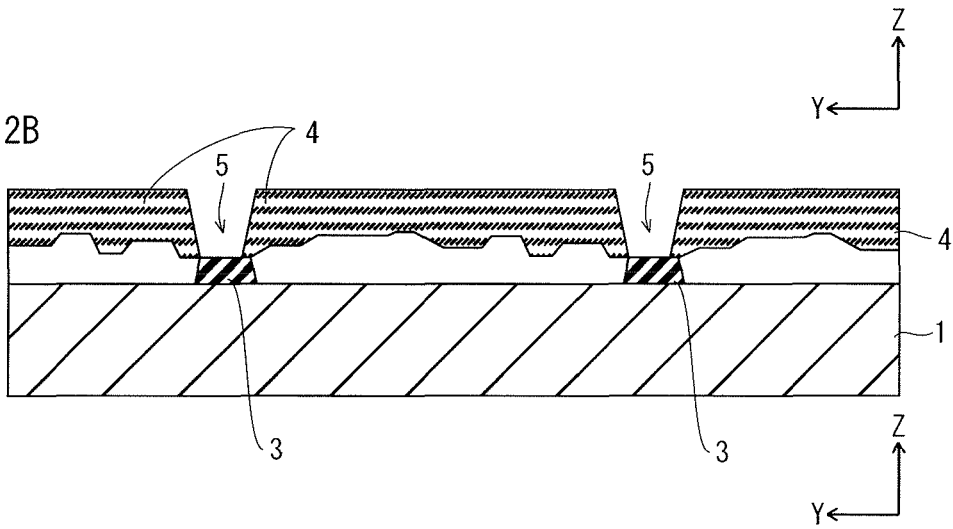

Subsequently, the planarizing film 4 is formed on the TFT layers 2 and the power supply electrodes 3 according to a photoresist method (FIG. 2B). Here, the planarizing film 4 is formed by using a conventional organic material having excellent electrical insulation property, and so as to have a thickness of approximately 4 μm. The forming of the planarizing film 4 is performed such that the contact holes 5 in the planarizing film 4, which are for electrically connecting the power supply electrodes 3 with the first electrodes 6 formed later in the manufacturing process, are formed at positions corresponding to positions between openings 13 that are adjacent in the column direction. Note that the planarizing film 4 and the contact holes 5 are formable at the same time by forming the planarizing film 4 according to a photoresist method and by using a predetermined pattern mask. Nevertheless, the method of forming the contact holes 5 is not limited to this method. For example, the contact holes 5 may be disposed in the planarazing film 4 by first forming a uniform planarizing film and then penetrating the planarizing film so formed at predetermined areas.

Figure 2C:
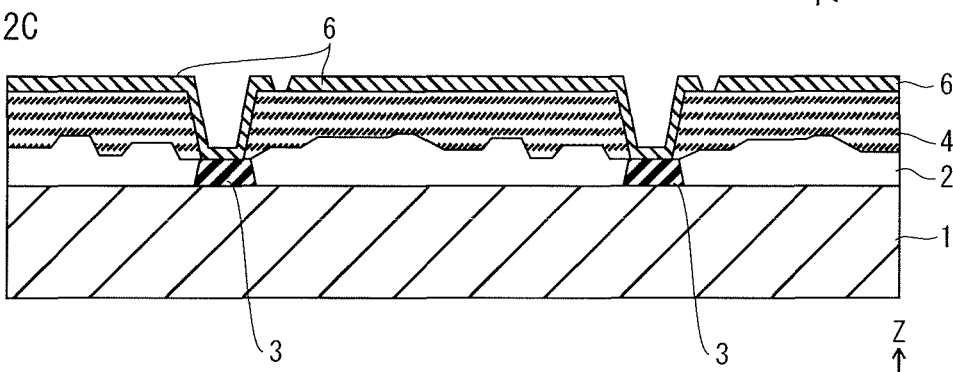

Subsequently, the first electrodes 6 are formed above the planarizing film 4 so formed according to, for example, a vapor deposition method or a sputtering method. The first electrodes 6 are formed by using a metal material and so as to have a thickness of approximately 50 nm. Here, the first electrodes 6 are formed while establishing electrical connection with the power supply electrodes 3 and so as to have predetermined shapes (for example, shapes corresponding to the respective areas where organic EL elements are to be formed) (FIG. 2C).

Note that when necessary, a uniform hole injection layer may be formed along a surface of the substrate 1 from above the first electrodes 6 and the power supply electrodes 3, according to a reactive sputtering method. Specifically, when forming such a hole injection layer, a metal material such as molybdenum or tungsten is used as the source of sputter particles (i.e., a sputter target), while argon gas is introduced into the chamber as the sputter gas and oxygen gas is introduced into the chamber as the reactive gas. Thus, a hole injection layer made of an oxide of molybdenum or tungsten is formed.

Here, note that as described in embodiment 7, pixel defining layers each partially overlapping with a corresponding one of the first electrodes 6 from above may be formed, after the first electrodes 6 are formed and before the bank layer 7 is formed. A pixel defining layer forming process for forming such pixel defining layers is performable by first applying a paste containing an electrically-insulative material, etc., according to a photoresist method and then performing patterning.

Figure 2D:
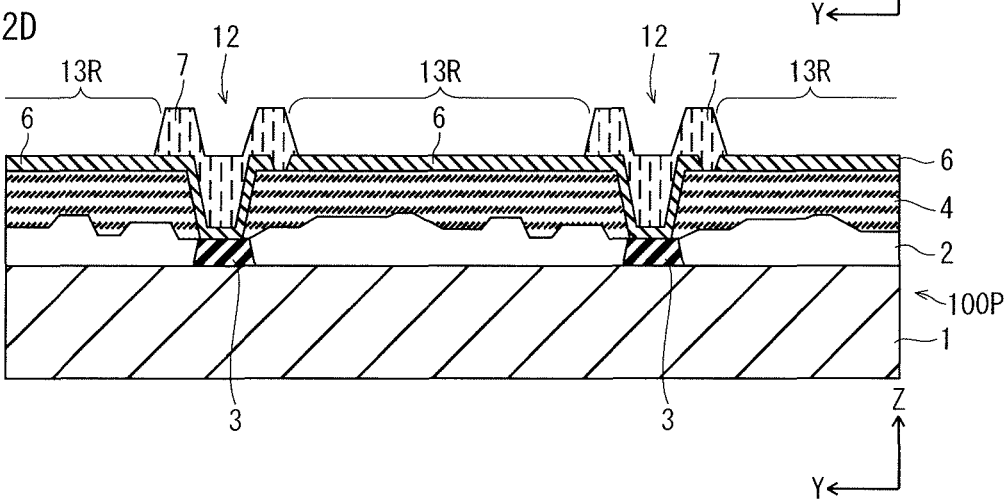

Subsequently, the bank layer forming process is performed. As the bank material, for example, a photosensitive resist material or a resist material containing a fluorine-based material, an acrylic material, or the like is prepared. The bank layer forming process is performable according to a photoresist method. That is, first, the bank material is uniformly applied along a surface of the substrate 1 from above the first electrodes 6, and further, photoresist is applied from above. Then, a mask having a pattern matching that of the bank layer 7 to be formed is placed on the photoresist so applied. Here, a conventional half-tone mask is usable as the mask. In addition, patterning of the bank layer 7 is performed such that each opening 13 formed as a result of the patterning exposes at least a portion of the corresponding first electrode 6. Subsequently, the photoresist is exposed to light via the mask, and thus a resist pattern is formed. Finally, redundant bank material and unhardened photoresist material are washed away by using an aqueous or non-aqueous etching solution (a release agent). This completes the patterning of the bank material. Subsequently, residual resist remaining in the vicinity of the patterned bank material is washed away and removed by using pure water. By performing the above-procedures, the bank layer 7, which has openings 13 formed therein at areas where organic EL elements are to be formed and which is liquid-repellent at least at a surface thereof, is formed as illustrated in FIG. 2D. Note that openings 13 are formed for each of the colors R, G, B; i.e., the openings 13B, the openings 13G, and openings 13B are formed. Note that in FIG. 2D, only openings 13R, which correspond to the color R, are illustrated. Here, note that the positional arrangement of the openings 13 is adjusted such that, as illustrated in FIG. 1B, between pixels (pixel groups) adjacent in the row direction, the positions of the openings 13R, 13G, 13B in one pixel (pixel group) are offset from the positions of the openings 13R, 13G, 13B in another pixel (pixel group) in the column direction by a fixed offset amount. The positional arrangement of the openings 13 is adjustable by adjusting the shape of the pattern provided to the mask.

As described above, the contact holes 5, in which the bank material shrinks, are disposed in the planarizing film 4. Due to this, the concave portions 12 are naturally formed in the top surface portion of the bank layer 7 (FIG. 2D). As such, the application target substrate 100P, which is a manufacture intermediate body of the organic EL display panel 100, is formed.

Note that in the bank layer forming process, adjustment may be performed of the contact angle of the bank layer 7 with respect to the ink that is to be ejected into the openings 13 in the organic light-emission layer forming process. Further, the bank layer 7 may be provided with liquid-repellency at least at a surface thereof. Such adjustments are performable by treating the surface of the bank layer 7 by using a predetermined alkaline solution, water, an organic solvent, etc., or by treating the surface of the bank layer 7 by performing plasma treatment.

Figure 7A:
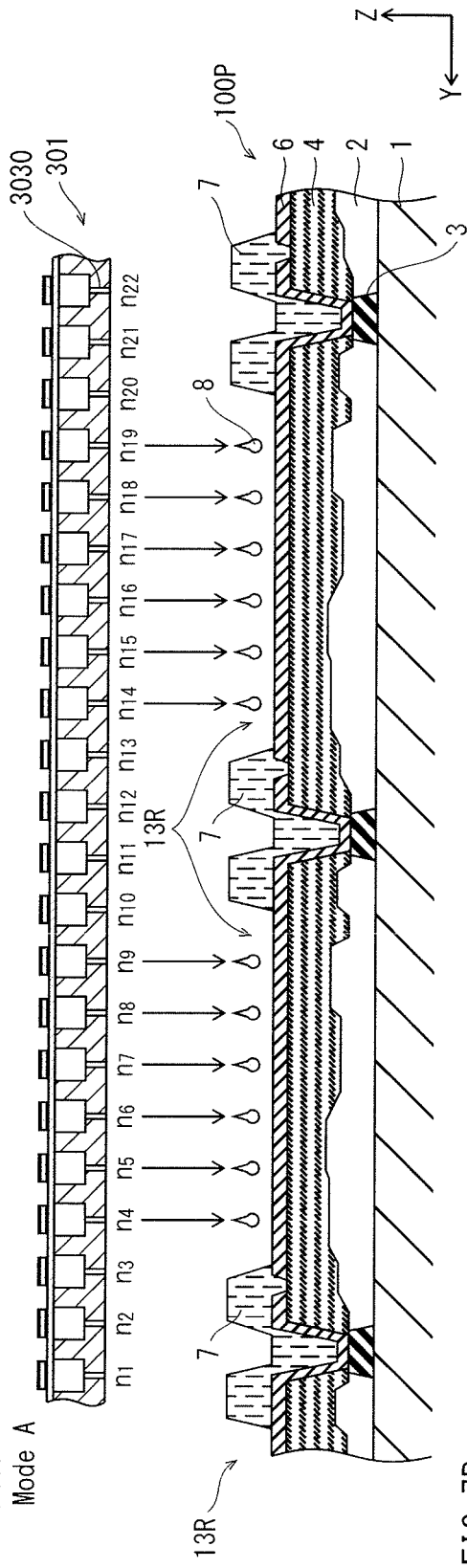
FIGS. 7A and 7B each illustrate a process in the manufacturing of the organic EL display panel 100.
Figure 7B:
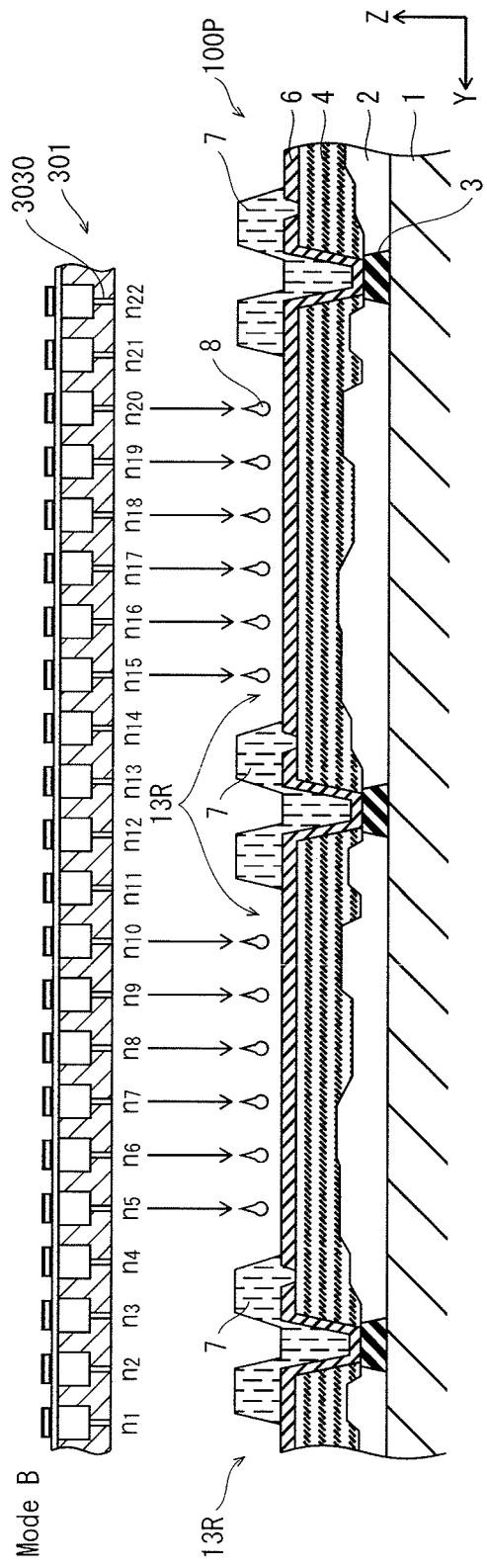

Subsequently, the organic light-emission layer forming process is performed. First, an organic material and a solvent, which are to be contained in the light-emission layer material, are mixed at a predetermined ratio, and thus an ink is prepared. The ink so prepared is supplied to the inkjet head 30 provided to an inkjet device system 1000 illustrated in FIG. 3. Then, the inkjet head 30 is used to apply the ink liquid droplets 8 with respect to the openings 13 in the row direction, according to a wet process in accordance with a conventional inkjet method (FIGS. 7A and 7B). During the application of ink, at least one of the application target substrate 100P and the inkjet head 30 is moved to cause relative movement of the application target substrate 100P and the inkjet head 30 with respect to one another.

Figure 8:
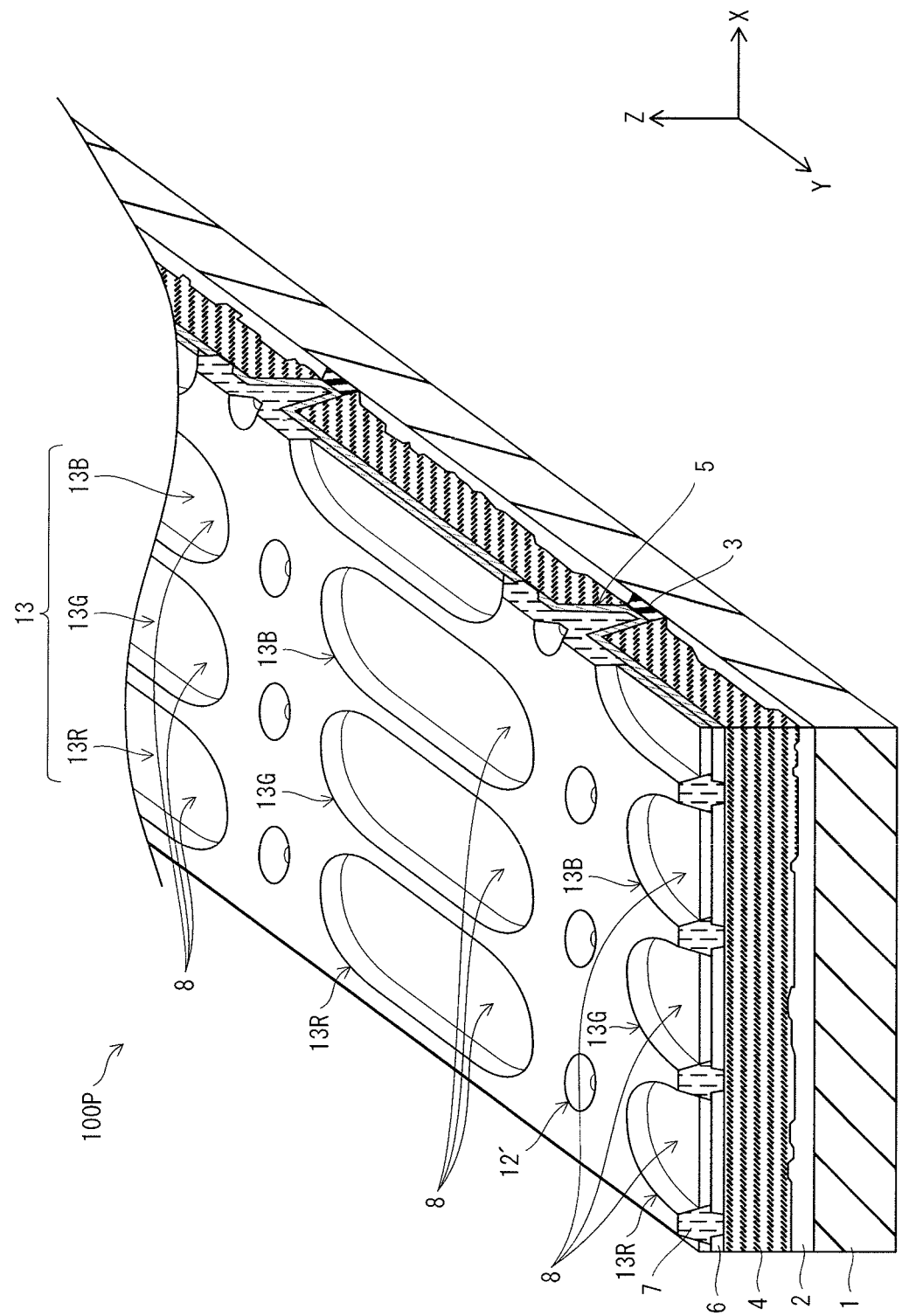
FIG. 8 is a perspective cross-sectional diagram illustrating the application target substrate 100P immediately following the application of ink.
Figure 9A:
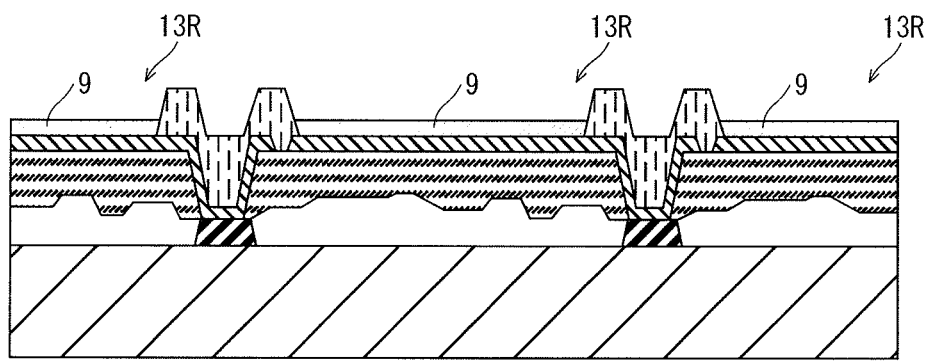
FIGS. 9A and 9B each illustrate a process in the manufacturing of an organic EL display panel.

FIG. 8 is a partial perspective diagram illustrating a state of the application target substrate 100P immediately after ink liquid droplets 8 are applied with respect to concave portions 12' and the openings 13R, 13G, 13B. The puddle of ink liquid droplets 8 in each of the openings 13R, 13G, 13B is formed by ink liquid droplets 8 being ejected at high speed from predetermined ones of the nozzles 3030 (a group of nozzles) of the inkjet head 30, which sweeps over and above the application target substrate 100P. By causing the solvent in the ink liquid droplets 8 to evaporate and drying the remainder, the organic light-emission layers 9 are formed in the openings 13R as illustrated in FIG. 9A. Organic light-emission layers 9 are similarly formed in the openings 13G and 13B.

Figure 9B:
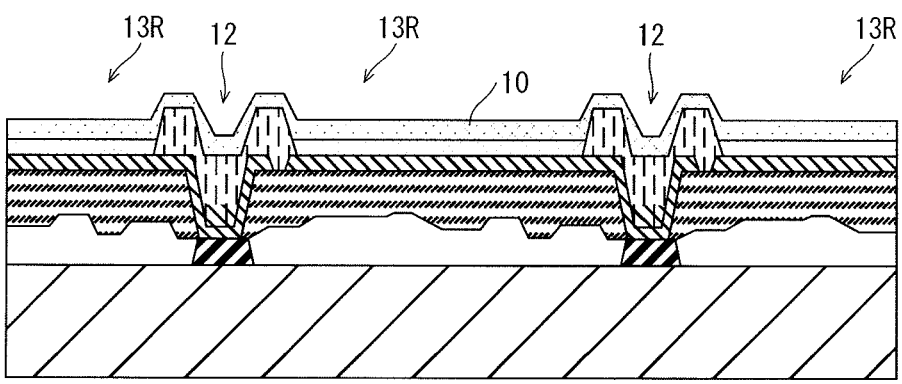

Subsequently, a film is formed to cover surfaces of the organic light-emission layers 9 so formed by performing vapor deposition by using a material such as ITO or IZO. Thus, the second electrode 10 is formed (FIG. 9B).

In addition, a sealing layer (not illustrated) is formed on a surface of the second electrode 10 by performing vapor film deposition by using a material such as SiN or SiON.

By performing the above procedures, the organic EL elements 11 are formed. This completes the manufacturing of the organic EL display panel 100.

(Details of Organic Light-emission Layer Forming Process)

Subsequently, detailed description is provided on the organic light-emission layer forming process. First, detailed description is provided on the inkjet device system 1000, which is used in the organic light-emission layer forming process, and subsequently, description is provided on how the organic light-emission layer forming process is performed.

(Inkjet Device System 1000)

Figure 3:
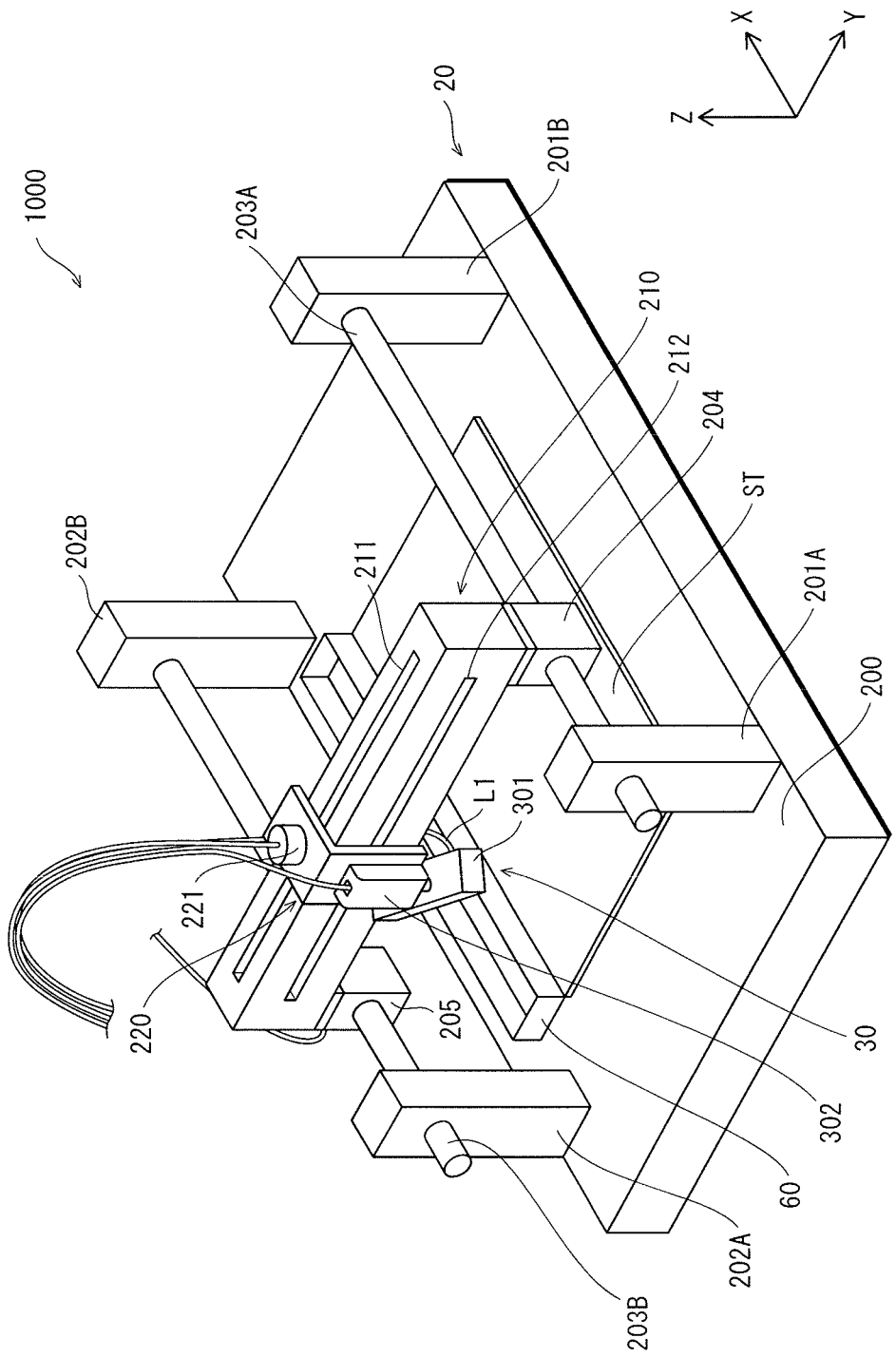
FIG. 3 is a perspective diagram illustrating major components of an inkjet device system 1000.
Figure 4:
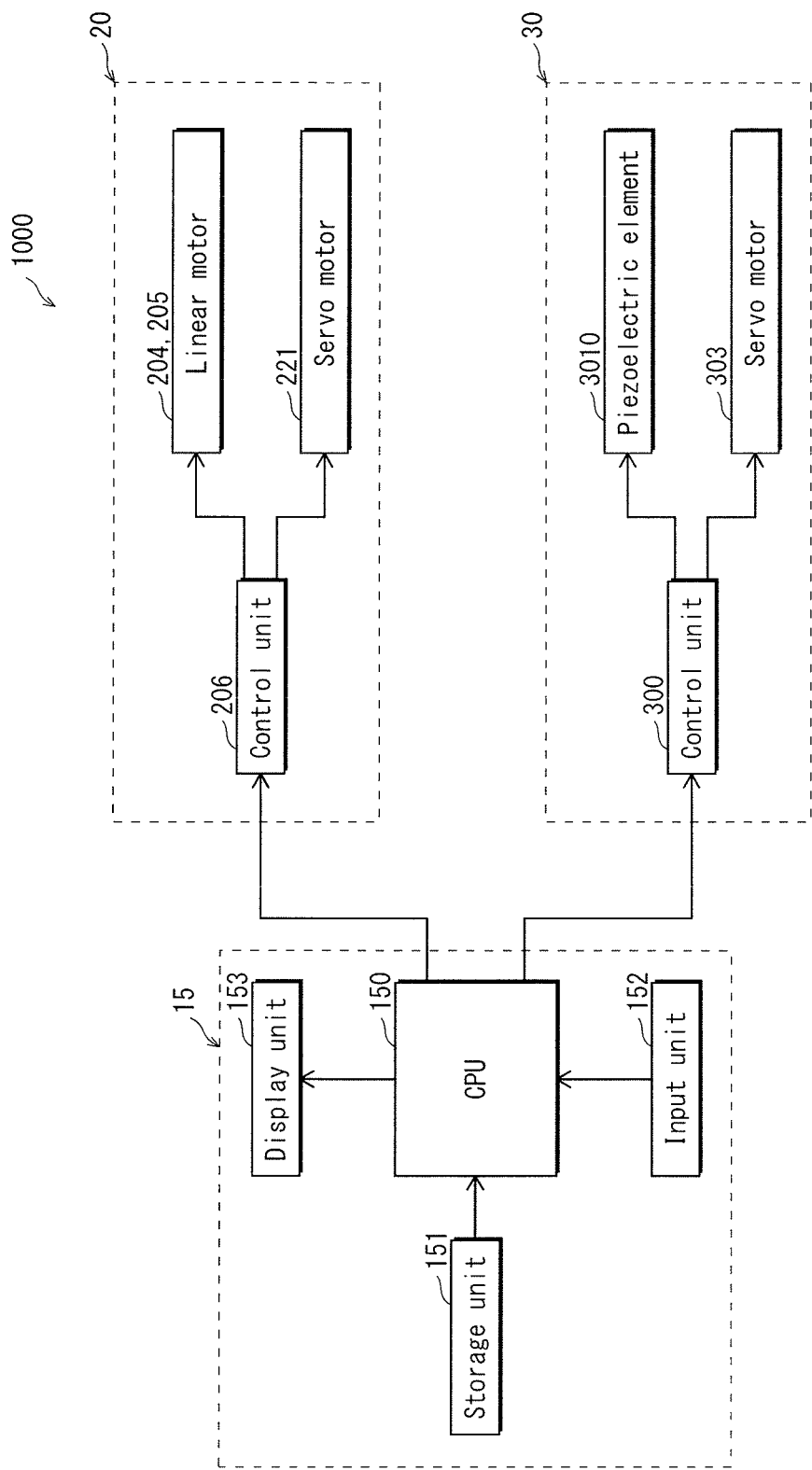
FIG. 4 is a diagram illustrating functional blocks of the inkjet device system 1000.

FIG. 3 is a perspective diagram illustrating the major components of the inkjet device system 1000 (hereinafter referred to simply as the "system 1000"). FIG. 4 is a diagram illustrating the functional blocks of the system 1000.

As illustrated in FIG. 4, the system 1000 includes: a control device (PC) 15; an inkjet table 20; and the inkjet head 30.

The control device 15 includes: a CPU 150; a storage unit 151; a display unit 153; and an input unit 152. The storage unit 151 is, for example, a mass-storage unit such as an HDD. The display unit 153 is, for example, a display. The control device 15 is, for example, a personal computer. The storage unit 151 stores therein a control program that the CPU 150 reads out from the storage unit 151 to drive and control the inkjet table 20. When the system 1000 is driven, the CPU 150 drives and controls each of the inkjet table 20 and the inkjet head 30 according to instructions that an operator inputs via the input unit 152, and according to the control program stored in the storage unit 151.

Note that a liquid droplet observation device for checking the state of the ink ejected from the inkjet head 30 may be connected to the system 1000. In such a case, the liquid droplet observation device may be controlled by the CPU 150.

(Inkjet Table 20)

For example, the inkjet table 20 is a gantry work table. The inkjet table 20 has an overall structure where a gantry (movable bridge) 210 is disposed so as to cross over a base table 200 and so as to be movable back and forth along a guide shaft pair composed of a guide shaft 203A and a guide shaft 203B (FIG. 3).

More specifically, the inkjet table 20 includes: the base table 200, whose main surface is rectangular; four columns, namely columns 201A, 201B, 202A, 202B; the guide shafts 203A, 203B; linear motors 204, 205; the gantry 210; and the inkjet head 30.

Each of the columns 201A, 201B, 202A, 202B has the shape of a pillar, and is disposed near different ones of the four corners of a Z-direction upper surface of the base table 200, which has the shape of a plate. A fixed stage ST and an ink pan (dish-like container) 60 are disposed in an inner region above the base table 200, which is surrounded by the columns 201A, 201B, 202A, 202B (FIG. 3). The fixed stage ST receives the application target substrate 100P. The ink pan 60 is used for preemptive ejection of ink, which is performed before the actual wet process to stabilize ink ejection.

The guide shaft 203A is supported by the columns 201A and 201B at two end portions thereof in a lengthwise direction of the base table 200 (X direction in FIG. 3). Similarly, the guide shaft 203B is supported by the columns 202A and 202B at two end portions thereof in the lengthwise direction of the base table 200. The guide shafts 203A and 203B are inserted through linear motors 204 and 205, respectively. The gantry 210 is placed on the linear motors 204 and 205 so as to cross over the base table 200 in a widthwise direction of the base table 200 (Y direction in FIG. 3). Due to having this structure, when the system 1000 is driven and the linear motors 204 and 205 are driven at the same speed in the same direction, the gantry 210 slides in a lengthwise direction of the guide shafts 203A and 203B (X direction in FIG. 3). The sliding of the gantry 210 is controlled accurately.

The gantry 210 has a guide groove 211. The guide groove 211 is parallel with a lengthwise direction of the gantry 210 (Y direction in FIG. 3). A small rack (not illustrated) extending in the lengthwise direction of the gantry 210 (Y direction in FIG. 3) is disposed inside the guide groove 211. Further, the gantry 210 has disposed thereon a movable body (carriage) 220. The movable body 220 is an L-shaped mount. The movable body 220 has a servo motor (movable body motor) 221 disposed thereon. The servo motor 221 has gearing (not illustrated) disposed at a tip of a motor shaft thereof. The gearing is in engagement with the rack of the guide groove 211. Thus, when the system 1000 is driven and the servo motor 221 is driven to rotate, a rack and pinion mechanism causes the movable body 220 to slide in a lengthwise direction of the gantry 210 (Y direction in FIG. 3). The sliding of the movable body 220 is controlled accurately. Further, a guide groove 212 is provided to the gantry 210, as illustrated in FIG. 3, for enabling stable slide movement of the movable body 220. In addition, the inkjet head 30 is attached to the movable body 220, as illustrated in FIG. 3.

Note that each of the linear motors 204, 205 and the servo motor 221 is connected to a control unit 206, as illustrated in FIG. 4. The control unit 206 is for separately and directly controlling and driving each of such motors. The control unit 206 is connected to the CPU 150 of the control device 15.

Further, note that the liner motors 204, 205 are examples of the mechanism for moving the gantry 210, and the servo motor 221 is one example of the mechanism for moving the movable body 220. That is, the liner motors 204, 205 and the servo motor 221 may not be included in the system 1000. Alternatively, a timing belt mechanism or a ball screw mechanism may be used, for example, to move at least one of the gantry 210 and the movable body 220.

(Inkjet Head 30)

The inkjet head 30 includes the head unit 301 and a main unit 302, both of which are illustrated in FIG. 3, and a control unit 300 illustrated in FIG. 4. The inkjet head 30 employs the piezo method.

The main unit 302 includes, disposed inside a housing thereof, a servo motor 303 (FIG. 4). The housing of the main unit 302 is fixed to the movable body 220.

The head unit 301 has a cuboid exterior shape. Further, a central portion of an upper surface of the head unit 301 is connected with a tip of a motor shaft of the servo motor 303, and thus, the head unit 301 hangs from the main unit 302 (FIG. 3). Due to this, when the motor shaft of the servo motor 303 rotates, the angle between the head unit 301 and the fixed stage ST changes.

Figure 5A:
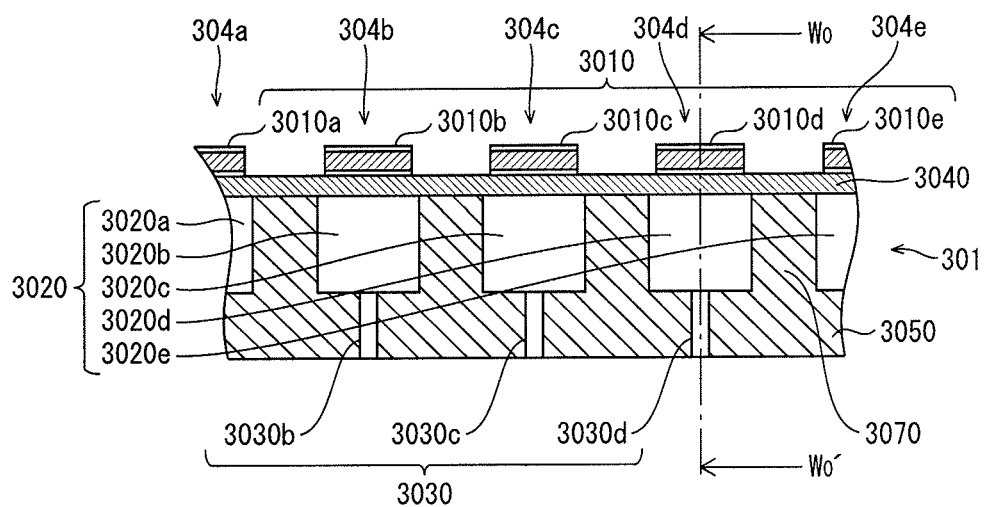
FIG. 5A is a diagram illustrating a cross-section of a head unit 301 taken along a lengthwise direction.
Figure 5B:
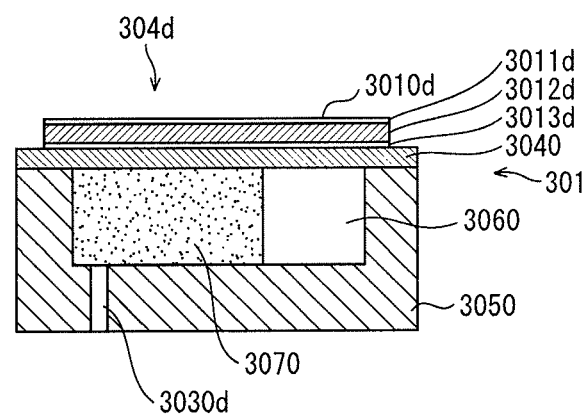
FIG. 5B is a diagram illustrating a cross-section of the head unit 301 taken along a line $W_0$-$W_0'$ in FIG. 5A (a cross-section of the head unit 301 taken along a widthwise direction).

Each of FIGS. 5A and 5B is a cross-sectional diagram illustrating the internal structure of the head unit 301. FIG. 5A illustrates a cross-section along a lengthwise direction of the head unit 301. FIG. 5B illustrates a cross-section taken along the line $W_0$-$W_0'$ in FIG. 5A (a cross-section along a widthwise direction of the head unit 301). Note that FIG. 5A illustrates only five ink ejection mechanism units, namely ink ejection mechanism units 304a through 304e, that are disposed adjacent to one another in the head portion 301. However, it should be noted that all of the ink ejection mechanism units provided to the head unit 301 have the same structure. In the following, description is provided on the structure of the head unit 301 while referring to the structure illustrated in FIG. 5A as an example.

The head unit 301 includes a plurality of ink ejection mechanism units, namely the ink ejection mechanism units 304a through 304e. Each of the ink ejection mechanism units 304a through 304e includes: a frame part 3050; a vibration plate 3040; and a piezoelectric element 3010 (3010a-3010e). The ink ejection mechanism units 304a through 304e are disposed in the head unit 301 at a predetermined pitch along the lengthwise direction of the head unit 301 (FIG. 5A). When viewing the entire head unit 301, a plurality of ink ejection mechanism units (hundreds or thousands of ink ejection mechanism units) are disposed in line at the predetermined pitch. As a specific example, 128 ink ejection mechanism units are provided to the head unit 301.

The frame part 3050 has, in an inside thereof, an ink container 3020 (3020a-3020e) and a nozzle 3030 (3030a-3030e). The frame part 3050 is made, for example, of a metal material such as SUS or a ceramic material. Inside the frame part 3050, the ink container 3020 (3020a-3020e) and the nozzle 3030 (3030a-3030e) are integrally formed as a single body by machine processing, etching, or electrical discharge machine processing being performed.

The ink container 3020 (3020a-3020e) is a space where ink is stored immediately before being ejected from the nozzle 3030 (3030a-3030e). The volume of the ink container 3020 (3020a-3020e) decreases when the piezoelectric element 3010 (3010a-3010e) and the vibration plate 3040 deform in the direction of the ink container 3020 (3020a-3020e), and returns to the initial level when the piezoelectric element 3010 and the vibration plate 3040 restore their original shapes. The ink containers 3020a through 3020e are partitioned from one another by a barrier wall 3070 (FIG. 5A, FIG. 5B). Further, as illustrated in FIG. 5B, a rear portion of each of the ink containers 3020a through 3020e is connected with an ink flow path 3060. An ink supply tube $L_1$, which extends into the head unit 301 from the outside, is connected to the ink flow path 3060 (FIG. 3). When the system 1000 is driven, ink from an external ink tank is supplied to the ink flow path 3060 via the ink supply tube $L_1$. Thus, each of the ink containers 3020a through 3020e is filled up with ink.

The nozzle 3030 (3030a-3030e) functions as an ink ejection unit. The nozzles 3030a through 3030e are formed so as to be arranged in line at a predetermined pitch at a bottom surface of the frame part 3050. Further, each of the nozzles 3030a through 3030e is formed so as to connect with a corresponding one of the ink containers 3020a through 3020e. Here, it should be noted that although the pitch at which the nozzles 3030a through 3030e are disposed in the head unit 301 is fixed, the relative nozzle pitch with respect to the application target substrate 100P is adjustable by adjusting a rotation angle of the motor shaft of the servo motor 303. As such, due to the CPU 150 controlling the rotation angle of the motor shaft of the servo motor 303, the number of adjacent nozzles 3030 included in a nozzle group moving over a predetermined opening 13 in the application target substrate 100P is adjustable.

The vibration plate 3040 is disposed so as to cover the ink containers 3020a through 3020e from above. The piezoelectric elements 3010a through 3010e are layered above the vibration plate 3040. The vibration plate 3040 is composed of a flexible thin plate made of stainless-steel or nickel. Thus, the vibration plate 3040 deforms along with the deformation of the piezoelectric elements 3010a through 3010e.

The piezoelectric elements 3010 (3010a-3010e) are piezoelectric elements. For example, the piezoelectric element 3010d includes an element main body 3012d and an electrode pair (FIG. 5B). The electrode pair is composed of electrodes 3011d and 3013d, and the element main body 3012d is disposed between the electrodes 3011d and 3013d. The element main body 3012d is a plate-like member made, for example, of lead zirconate titanate or the like.

The control unit 300 illustrated in FIG. 4 includes a drive circuit that is capable of separately driving each of the piezoelectric elements 3010 provided to the head unit 301. When the system 1000 is driven, with respect to a specific one of the piezoelectric elements 3010, the control unit 300 applies a waveform voltage of a drive frequency of several hundred Hz, for example. Due to this application of voltage, the specific piezoelectric element 3010 undergoes deformation, which results in the vibration plate 3040 vibrating. Thus, the volume of a corresponding ink container 3020 decreases or returns to the initial level. A rectangular pulse voltage waveform may be used as the waveform of voltage applied to each of the piezoelectric elements 3010. When using a rectangular pulse waveform voltage, the deformation of a specific piezoelectric element 3010 takes place in sync with the rise of the pulse waveform of the voltage, which brings about deformation of the vibration plate 3040 and the consequent decrease in the volume of a corresponding ink container 3020. Further, when using a rectangular pulse waveform voltage, the restoration of the shape of a specific piezoelectric element 3010 and the shape of the vibration plate 3040 takes place in sync with the drop of the pulse waveform of the voltage, which results in the volume of a corresponding ink container 3020 returning to its initial level. Ink is ejected from a nozzle 3030 when the volume of a corresponding ink container 3020 decreases. Here, it should be noted that the waveform of the voltage applied to each of the piezoelectric elements 3010 is not limited to a rectangular waveform, and alternatively, may be a stepwise waveform or a waveform having a part with a curved shape.

Note that the application of voltage to the piezoelectric elements 3010 is controlled by the CPU 150 providing instructions to the control unit 300 according to the control program. More specifically, the instruction provided by the CPU 150 indicates by using which waveform the application of voltage is to be performed at a predetermined timing with respect to each piezoelectric element 3010, and is provided taking into consideration the speed at which the head unit 301 is caused to move over the application target substrate 100P. As one example of an initial configuration of such control, the CPU 150 may perform control according to the control program such that the same ink volume is ejected from each of the nozzles 3030.

Further, the number of lines of the nozzles 3030a through 3030e in the head unit 301 is not limited to one. That is, a plurality of lines of the nozzles 3030a through 3030e may be disposed, or a plurality of lines of the nozzles 3030a through 3030e may be disposed such that the nozzles 3030 included therein form a zigzag pattern.

Further, the inkjet head 30 is not limited to being provided with only one head unit 301. Alternatively, the inkjet head 30 may be provided with two or more head units 301. For example, when providing the inkjet head 30 with two head units 301, the two head units 301 may be arranged side-by-side and fixed to the tip of the motor shaft of the servo motor 303 of the main unit 302. Note that by adjusting the relative nozzle pitch with respect to the application target substrate 100P by using a plurality of head units 301 arranged side-by-side, the actual pitch of ink (the pitch between ink liquid droplets arriving at the application target substrate 100P) can be set to a value that takes into consideration the pitch at which nozzles are disposed in each of the two head portions 301, both of which are disposed so as to form an angle with the application target substrate 100P. Thus, the relative nozzle pitch above the application target substrate 100P can be set with an increased level of precision compared to when using only one head portion 301.

Further, the head unit 301 is not limited to being provided with one ink flow path 3060. Alternatively, a plurality of ink flow paths 3060 may be provided to the inside of the head unit 301. In such a case, the ink ejection mechanism units may be put into groups, and ink for a different light-emission color or ink including different components may be supplied to each of the groups via a separate, dedicated ink flow path.

(how Organic Light-Emission Layer Forming Process is Performed)

In the following, description is provided on the procedures when performing the organic light-emission layer forming process by using the system 1000.

[Configuration of System 1000]

When initially performing a wet process by using the system 1000, the operator of the system 1000 operates the input unit 152 and makes the following configurations with respect to the system 1000, for example.

The operator inputs, to the control device 15, arrangement information indicating how openings 13 are arranged in the application target substrate 100P. The arrangement information includes: the row-direction size and column-direction size of each opening 13; the pitch at which openings 13 are disposed in each of the row direction and the column direction; the number of openings provided in each of the row direction and the column direction; etc. In addition, the arrangement information includes information on the offset between groups of openings.

Due to the arrangement information being input, the CPU 150 is able to acknowledge the positions of the openings 13 in the application target substrate 100P, and acknowledge which nozzles 3030 of the head unit 301 corresponds to which of the openings 13. In the application of ink with respect to openings belonging to a first column-direction array and openings belonging to a second column-direction array, the CPU 150 determines which nozzles 3030 are to eject ink and which nozzles are not to eject ink with respect to openings belonging to each of the first and second column-direction arrays, based on the arrangement information and by operating according to the control program.

The following provides description on examples of information included in the information on the offset between groups of openings. Needless to say, other types of information may be set as the information on the offset between groups of openings.

a) information indicating whether openings in the application target substrate 100P that are in the same row are offset in units of pixels or in units of subpixels b) information indicating whether openings in the application target substrate 100P that are in the same row are offset in a certain cyclic pattern or randomly (including information indicating the number of nozzles in the column direction to be switched between the ink ejection state and the ink non-ejection state)

Here, the number of nozzles to be switched between the ink ejection state and the ink non-ejection state when the head unit 301 is moved in the row direction can be adjusted as necessary. For example, when taking into consideration a typical organic light-emission layer forming process, the adjustment, according to the positions of the openings 13, of the number of nozzles to be switched between the ink ejection state and the ink non-ejection state during the movement of the head unit 301 is possible by disposing the openings 13 such that the offset amount is no smaller than 10% and no greater than 50% of the pitch at which the openings 13 are disposed in the column direction.

Note that increasing the number of nozzles that are switched between the ink ejection state and the ink non-ejection state during the movement of the head unit 301 results in an increase in the likelihood of a nozzle 3030 ejecting an erroneous ink volume being switched between the ink ejection state and the ink non-ejection state when the switching between nozzle groups is performed. Such a configuration is preferable, since stripe unevennesses are prevented more effectively.

Alternatively, the number of nozzles that are switched between the ink ejection state and the ink non-ejection state when the switching between nozzle groups is performed may be reduced by reducing the number of nozzles 3030 used for ejecting ink liquid droplets with respect to a single opening 13. Such a modification may be made by increasing the pitch between the ink liquid droplets arriving at the openings 13. Even when making such a modification, it is preferable that the offset amount by which a group of openings belonging to a first column-direction array and a group of openings belonging to a second column-direction array are offset with respect to one another is set to no smaller than the pitch between ink liquid droplets arriving at the application target substrate 100P and no greater than 50% of the pitch at which the openings 13 are disposed in the column direction.

In specific, when considering a case where in the organic light-emission layer forming process, a nozzle group composed of seven to ten nozzles 3030 are used to eject ink liquid droplets with respect to a single opening 13, it is plausible that about one to three nozzles 3030 are switched between the ink ejection state and the ink non-ejection state when the switching between nozzle groups is performed.

[Preparation of System 1000]

When the configuration of the system 1000 is completed, the operator places the application target substrate 100P on the fixed stage ST. Here, the operator is to put the application target substrate 100P in accurate alignment with the inkjet table 20.

According to information input by the operator, the CPU 150, via the control unit 300, causes the motor shaft of the servo motor 303 to rotate by a predetermined angle, and thus sets the angle of the head unit 301 with respect to the fixed stage ST.

Figure 6:
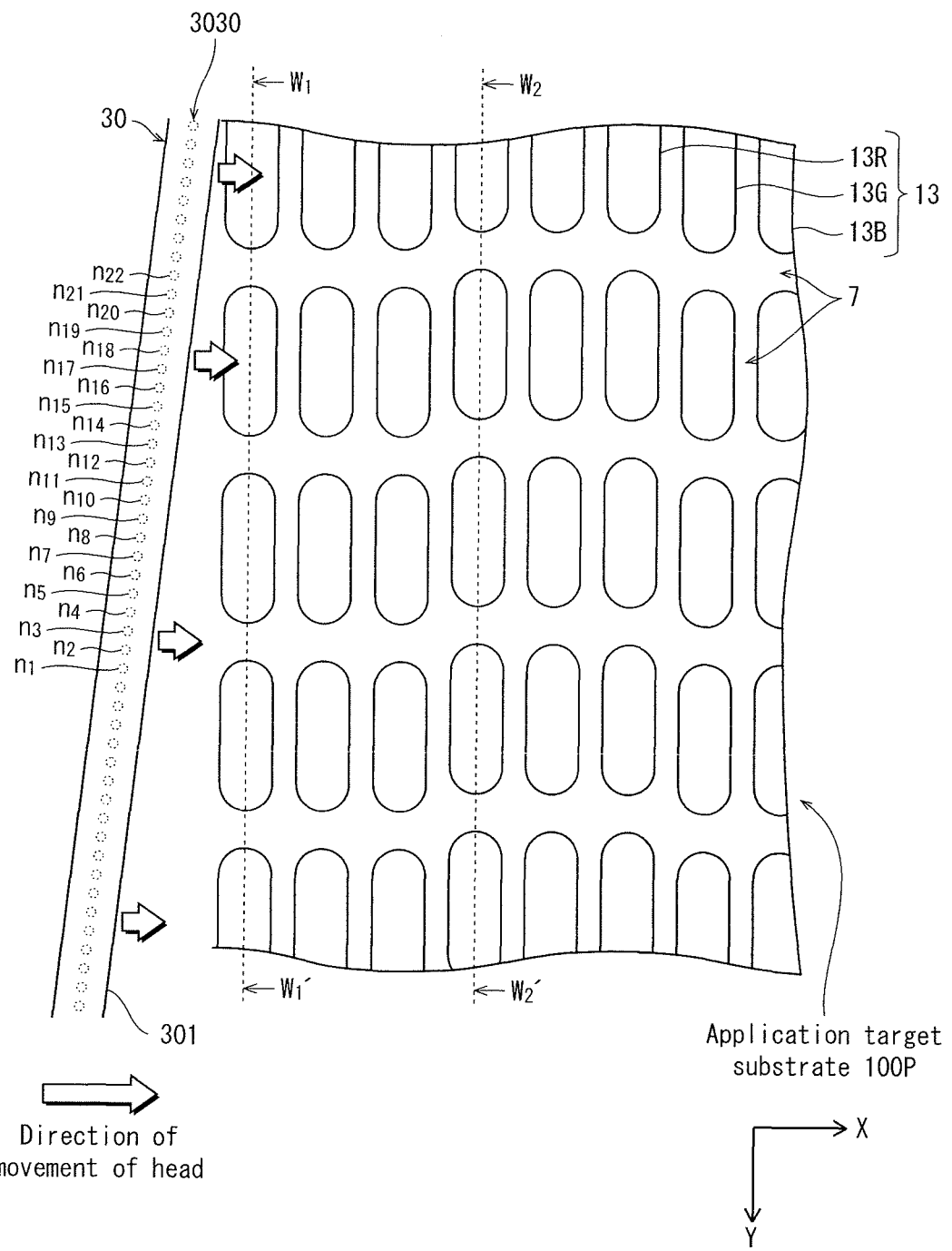
FIG. 6 is a diagram illustrating the positional relationship between the head unit 301 and an application target substrate 100P during application of ink.

FIG. 6 illustrates the positional relationship between the inkjet head 30 (the head unit 301) and the application target substrate 100P during ink application. FIG. 6 illustrates a case where the head unit 301 is rotated such that a predetermined angle is formed between a lengthwise direction of the head unit 301 and the column direction of the application target substrate 100P. When rotating the head unit 301 with respect to the application target substrate 100P in such a manner, the actual pitch of ink liquid droplets with respect to the openings 13 (the pitch between ink liquid droplets when actually arriving at the openings 13) is adjusted to be smaller compared to when the head unit 301 is not rotated. Such adjustment of the actual pitch of ink liquid droplets with respect to each opening 13 (the pitch between ink liquid droplets when actually arriving at the application target substrate 100P) is performed as necessary, taking into considerations conditions such as the specifications, the sizes, etc., of the application target substrate 100P, the openings 13, etc.

Further, the adjustment of the angle of the head unit 301 with respect to the application target substrate 100P may be performed at any point before the application of ink with respect to the application target substrate 100P is actually started.

Subsequently, the operator causes ink, whose composition has been adjusted, to be stored in an ink tank, and then activates a pump. Thus, the ink is sent to the ink containers 3020 in the head unit 301 via the supply tube L1 and densely fills up the ink containers 3020.

Then, the operator operates the control device 15 and causes the head unit 301 to move to a position above the ink pan 60. At this point, the operator causes the CPU 150 to apply voltage with respect to the piezoelectric elements 3010 by using the control unit 300, according to the control program. Due to this, ink is ejected from each of the nozzles 3030 to the ink pan 60.

Note that when a liquid droplet observation device is incorporated in the system 1000 as described above, a CCD camera may capture the state of the ink being ejected from the nozzles 3030, and the CPU 150 may cause the display unit 153 to display the state of the ink in real-time. In such a case, the operator checks, by using the display unit 153, whether ink is being properly ejected from each and every one of the nozzles 3030, and causes the ejection of the ink to be continued until the ejection of ink from the nozzles 3030 becomes stable.

Subsequently, the operator causes the CPU 150 to set the application voltage value for each nozzle 3030 to a predetermined voltage value (initial voltage value) according to the control program. This causes each and every one of the nozzles 3030 to eject the same volume of ink.

[Instruction of Execution of Ink Application Process]

When the preparation of the system 1000 is completed, the operator instructs the system 1000 to execute the ink application process.

The CPU 150 controls and drives the linear motors 204, 205 and the servo motor 221 via the control unit 206, according to the control program (FIG. 4). As a result, the CPU 150 causes the head unit 301 to move in the row direction with respect to the application target substrate 100P, as illustrated in FIG. 6. Subsequently, the CPU 150 causes specific nozzles 3030 of the head unit 301 to intermittently eject ink liquid droplets with respect to corresponding openings 13 by applying a pulse voltage to each of the specific nozzles 3030 at predetermined timings. The CPU 150 causes the head unit 301 to sweep over and across the application target substrate 100P and eject a predetermined amount of ink to every opening 13 with respect to which the ink of one same color is to be ejected. When ink is ejected to openings 13 corresponding to one color as described above, the ink ejected from the head unit 301 is changed to that of a different color. Following this point, ink of the different color is ejected with respect to other ones of the openings 13 in the same manner as described above.

[Organic Light-Emission Layer Forming Process]

Figure 10A:
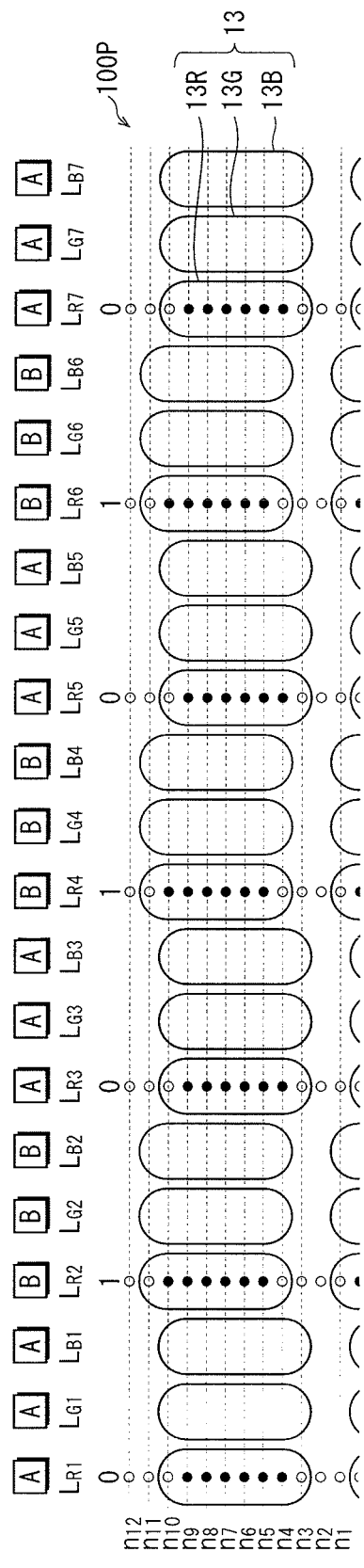
FIG. 10A is an enlarged front-view diagram of the application target substrate 100P for explaining an organic light-emission layer forming process pertaining to embodiment 1.

In the following, specific description is provided on how the organic light-emission layer forming process is performed by using the system 1000, with reference to FIG. 6, FIGS. 7A and 7B, FIG. 8, FIG. 9A, and FIG. 10A. FIG. 7A illustrates a cross-section of the application target substrate 100P along a first column-direction array of openings 13 (extending along line $W_1$-$W_1'$) in FIG. 6, and FIG. 7B illustrates a cross-section of the application target substrate 100P taken along a second column-direction array of openings 13 (extending along line $W_2$-$W_2'$) in FIG. 6. FIGS. 7A and 7B illustrate a case where nozzles 3030 indicated by nozzles number $n_1$ through $n_{22}$ are controlled. However, in actual implementation, all of the nozzles 3030 provided to the head unit 301 are controlled. FIG. 10A is an enlarged front-view of the application target substrate 100P during application. In FIG. 10A, the reference sign "A" indicates a mode A where nozzles $n_4$ through $n_9$ (a first group of nozzles) are used. Further, in FIG. 10A, the reference sign "B" indicates a mode B where nozzles $n_5$ through $n_{10}$ (a second group of nozzles) are used. Further, the reference sign "$L_R$" indicates a column-direction array of openings of the color R, the reference sign "$L_G$" indicates a column-direction array of openings of the color G, and the reference sign "$L_B$" indicates a column-direction array of openings of the color B. Further, in FIG. 10A, only some of the nozzles in FIG. 6 is illustrated for the sake of convenience. Further, the filled circles in FIG. 10A indicate nozzles that actually eject ink liquid droplets 8.

When the head unit 301 is caused to move in the row direction as illustrated in FIG. 6 and arrives above openings 13R over which the line $W_1$-$W_1'$ is illustrated in FIG. 7A (corresponds to the column-direction array $L_{R1}$ in FIG. 10A), the CPU 150 uses nozzles 3030 of mode A for ink application, according to the control program. That is, as illustrated in FIGS. 7A and 10A, the CPU 150 assigns the nozzles 3030 indicated by nozzle numbers $n_4$-$n_9$ and $n_{14}$-$n_{19}$ as drive-target nozzles. The CPU 150 drives nozzles $n_4$-$n_9$ and nozzles $n_{14}$-$n_{19}$, and applies a pulse voltage to each of nozzles $n_4$-$n_9$ and nozzles $n_{14}$-$n_{19}$ to cause nozzles $n_4$-$n_9$ and nozzles $n_{14}$-$n_{19}$ to eject ink liquid droplets 8 of the color R with respect to the inside of the openings 13R over which the line $W_1$-$W_1'$ is illustrated in FIG. 7A. Meanwhile, the CPU 150 does not drive the rest of the nozzles 3030 illustrated in FIG. 10A. More specifically, the CPU 150 performs ON control with respect to nozzles $n_4$-$n_9$ and nozzles $n_{14}$-$n_{19}$ while performing OFF control with respect to nozzles $n_1$-$n_3$ and nozzles $n_{10}$-$n_{13}$.

Figure 10B:
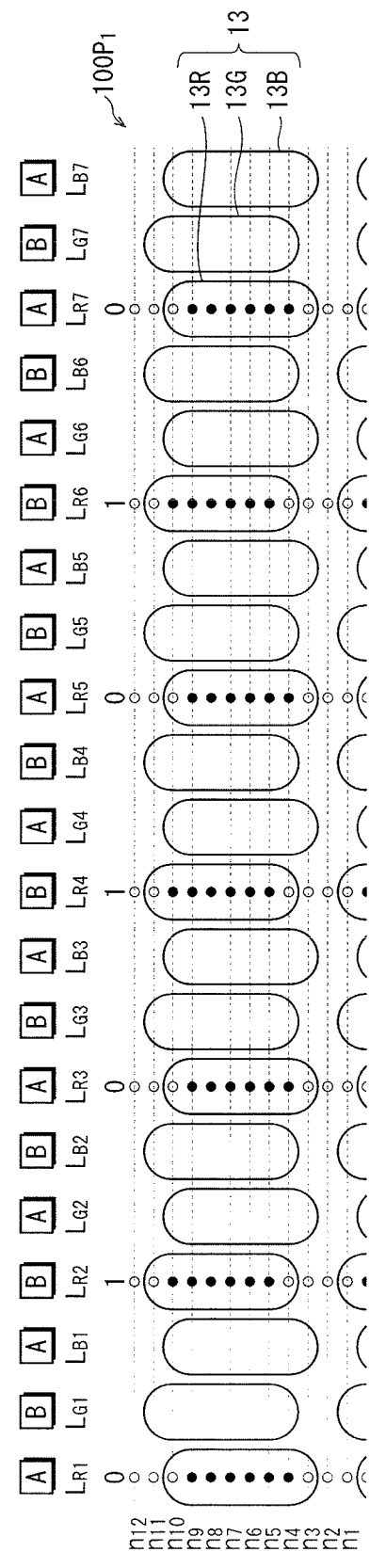
FIG. 10B is an enlarged front-view diagram of the application target substrate $100P_1$ for explaining an organic light-emission layer forming process pertaining to embodiment 2.

Subsequently, when the head unit 301 arrives above openings 13R over which the line is illustrated in FIG. 7B (corresponds to the column-direction array $L_{R2}$ in FIG. 10A), the CPU 150 uses nozzles 3030 of the mode B for ink application, according to the control program. That is, as illustrated in FIGS. 7B and 10B, the CPU 150 assigns the nozzles 3030 indicated by nozzle numbers $n_5$-$n_{10}$ and $n_{15}$-$n_{20}$ as drive-target nozzles. The CPU 150 drives nozzles $n_5$-$n_{10}$ and $n_{15}$-$n_{20}$, and applies a pulse voltage to each of nozzles $n_5$-$n_{10}$ and $n_{15}$-$n_{20}$ to cause nozzles $n_5$-$n_{10}$ and $n_{15}$-$n_{20}$ to eject ink liquid droplets 8 of the color R with respect to the inside of the openings 13R over which the line $W_2$-$W_2'$ is illustrated in FIG. 7B. Meanwhile, the CPU 150 does not drive the rest of the nozzles 3030 illustrated in FIG. 10A. More specifically, the CPU 150 performs ON control with respect to nozzles $n_5$-$n_{10}$ and nozzles $n_{15}$-$n_{20}$ while performing OFF control with respect to nozzles $n_1$-$n_4$ and nozzles $n_{11}$-$n_{14}$.

Following this point, each time the head unit 301 arrives above a corresponding column-direction array (i.e., column-direction arrays $L_{R3}$, $L_{R4}$, $L_{R5}$, $L_{R6}$, $L_{R7}$, and so on), the CPU 150 performs the switching between mode A and mode B as illustrated in FIG. 10A, thereby assigning predetermined ones of the nozzles 3030 as drive target nozzles and causing such nozzles to eject ink liquid droplets 8 with respect to the openings 13 in the corresponding column-direction array.

When ink of the color R has been applied with respect to each of the openings 13 in the column-direction arrays $L_{R3}$, $L_{R4}$, $L_{R5}$, $L_{R6}$, $L_{R7}$, and so on in the application target substrate 100P as illustrated in FIG. 10A, the CPU 150, based on the same operations as described above, causes ink of the color G to be ejected with respect to the openings 13 in the column-direction arrays $L_{G1}$, $L_{G2}$, $L_{G3}$, and so on. Subsequently, the CPU 150, based on the same operations as described above, causes ink of the color B to be ejected with respect to the openings 13 in the column-direction arrays $L_{B1}$, $L_{B2}$, $L_{B3}$, and so on. Finally, the forming of the organic light-emission layers 9 is completed by drying and thus removing the solvent from the ink liquid droplets 8 (FIG. 8) ejected with respect to all of the openings 13 in the application target substrate 100P (FIG. 9A).

In the example of the organic light-emission layer forming process described above, the usage state of nozzles $n_1$, $n_4$, $n_{10}$, $n_{14}$, $n_{20}$ is switched while the head unit 301 moves over the application target substrate 100P. Due to this, even when one of the nozzles $n_1$, $n_4$, $n_{10}$, $n_{14}$, $n_{20}$ ejects an erroneous ink volume, when the nozzle ejecting the erroneous ink volume is switched between the ink ejection state and the ink non-ejection state due to the switching between mode A and mode B, a situation is avoided where the same, erroneous ink volume is continuously ejected with respect to openings of the same color that are in the same row.

When ink has been ejected with respect to all of the openings 13 in the application target substrate 100P, the organic light-emission layers 9 are formed through the drying of solvent.

As such, in the organic light-emission layer forming process, when ink liquid droplets 8 are applied with respect to openings 13 by causing the head unit 301 to move in the row direction, the group of nozzles 3030 used to apply ink with respect to openings in one row is switched for each column-direction array. Due to this, even when the head unit 301 includes a nozzle that ejects an erroneous ink volume, when the nozzle ejecting the erroneous ink volume is switched between the ink ejection state and the ink non-ejection state due to the switching of nozzle groups, a situation is avoided where the same, erroneous ink volume is continuously ejected with respect to openings in the same row. Thus, even when the head unit 301 includes a nozzle that ejects an erroneous ink volume, it is ensured that the ink volume ejected by the nozzles 3030 with respect to an opening belonging to the first column-direction array and the ink volume ejected with respect to an opening belonging to the second column-direction array differ from one another.

As a result, in the organic EL display panel 100, which includes the organic light-emission layers 9 formed through the above-described organic light-emission layer forming process, the risk is reduced of organic light-emission layers having the same erroneous film thickness being formed adjacent to one another in line in the same row, even when a nozzle 3030 ejecting an erroneous ink volume is used in the organic light-emission layer forming process. As such, the occurrence of stripe unevennesses when the organic EL display panel 100 is driven is suppressed, and the organic EL display panel 100 achieves excellent image display quality.

<Experiment for Confirming Effect>

An experiment was carried out to confirm the effect of embodiment 1 through simulation. In the following, description is provided on the details of the experiment and an analysis is made of the results of the experiment, with reference to FIGS. 13A through 13D and FIG. 14.

[Details of Experiment]

In the experiment, evaluation was performed of four organic EL panels: (i) an organic EL panel in which openings belonging to a first column-direction array and openings belonging to a second column-direction array were not offset with respect to one another (conventional example); (ii) an organic EL panel in which openings belonging to a first column-direction array and openings belonging to a second column-direction array were offset with respect to one another by a distance equal to a pitch at which nozzles are disposed in the column direction (hereinafter referred to as a nozzle pitch) in the inkjet head used in the experiment (application example 1); (iii) an organic EL panel in which openings belonging to a first column-direction array and openings belonging to a second column-direction array were offset with respect to one another by a distance equal to twice the nozzle pitch (application example 2); and (iv) an organic EL panel in which openings belonging to a first column-direction array and openings belonging to a second column-direction array were offset with respect to one another by a distance equal to three times the nozzle pitch (application example 3). Note that each of the four panels used in this experiment had one hundred pixels in the column direction, and two-hundred pixels in the row direction. Further, the inkjet head used in the experiment was configured such that ten nozzles were used to apply ink with respect to a single opening.

Further, the inkjet head used in the experiment had a total of 1,500 nozzles. In the experiment, the inkjet head was configured such that the nozzles had ink volumes differing from one another by a maximum of ±10%. Further, the average of the ink volumes of the nozzles was calculated, and the average ink volume so calculated was set as a reference value "1", for normalization. Thus, the difference of the ink volume of each nozzle with respect to the average ink volume was made indictable by using a proportional value (within the range of 0.91-1.08) comparable with the average ink volume (reference value 1.00), and a normal distribution of such values was yielded. Note that in the following, the difference of the ink volume of a given nozzle with respect to the average ink volume of the nozzles is referred to as a "relative ink volume difference" of the given nozzle. The application of ink with respect to the four panels described above was performed by using the inkjet head configured as described above.

[Analysis of Experiment Results]

In the following, the results of the simulation experiment are analyzed.

In each of FIGS. 13A through 13D, stripe unevennesses appearing at different value ranges of the relative ink volume difference are schematically mapped onto a corresponding one of the four panels described above. Specifically, FIG. 13A corresponds to the panel of the conventional example, FIG. 13B corresponds to the panel of application example 1, FIG. 13C corresponds to the panel of application example 2, and FIG. 13D corresponds to the panel of application example 3.

Figure 13A:
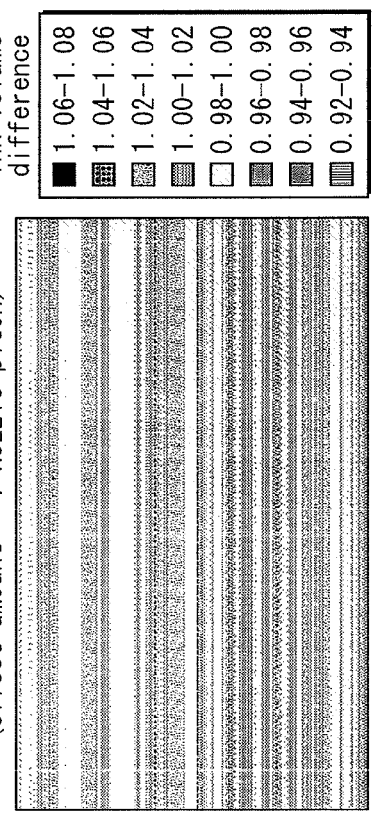
FIGS. 13A through 13D are diagrams (schematic mapping diagrams of stripe unevennesses) illustrating results of experiments for confirming the effects of the configuration pertaining to embodiment 1.

When referring to FIG. 13A, which illustrates the conventional example where openings belonging to different column-direction arrays are not offset with respect to one another, a given nozzle ejects the same ink volume with respect to openings in a same row, and this applies to all nozzles of the inkjet head. Due to this, a great number of stripe unevennesses clearly appear for each value range of the normal distribution.

Figure 13B:
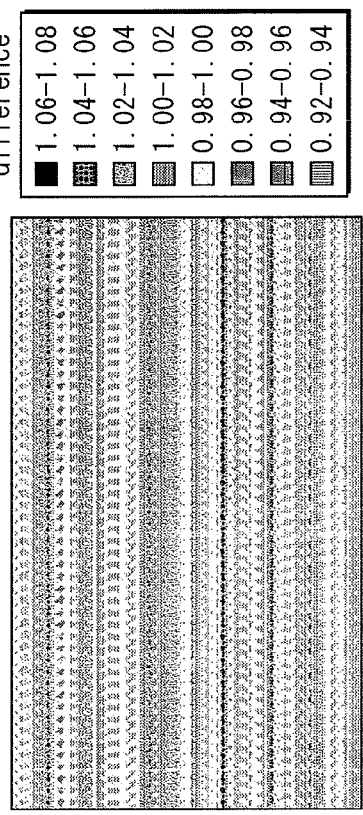
Figure 13C:
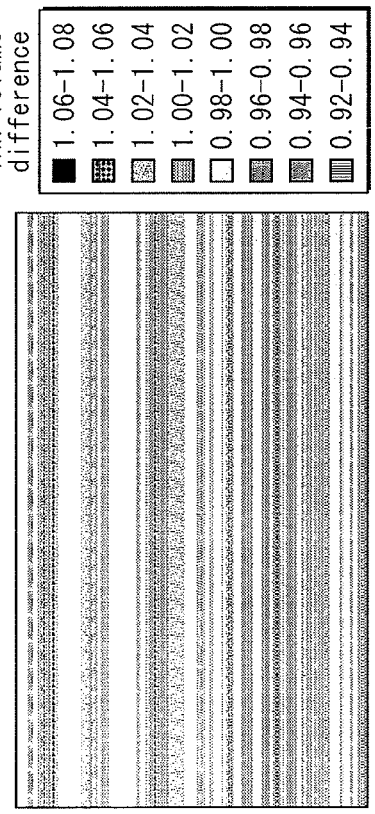
Figure 13D:
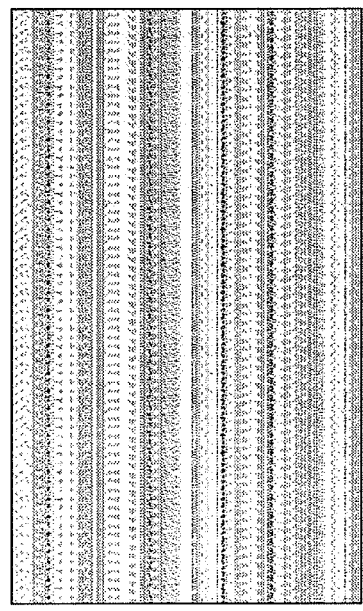

In contrast, when referring to each of FIGS. 13B, 13C, 13D, which respectively illustrate the application examples 1, 2, 3 where column-direction arrays of openings are offset with respect to one another by a predetermined offset amount, the stripe unevennesses appearing have jagged patterns. In other words, the risk of stripe unevennesses that are continuous in the row direction being formed was reduced compared to the conventional example. This effect became more prominent for greater offset amounts. According to analysis by the present inventors, this effect results from openings being disposed such that a first column-direction array of openings and a second column-direction array of openings are offset with respect to one another, and thus, a situation was prevented where the same erroneous ink volume is continuously applied with respect to openings in the same row.

Note that the application example 3 illustrated in FIG. 13D, where the offset amount between column-direction arrays of openings is greatest, achieved the effect of preventing stripe unevennesses to the greatest extent. Based on this, the present inventors made an assumption that the greater the offset amount between column-direction arrays of openings is, the greater the effect of preventing the occurrence of stripe unevennesses is. However, care needs to be taken since excessively increasing the offset amount between column-direction arrays of openings results in the alignment of pixels in the row direction becoming more irregular than desired.

Figure 14:
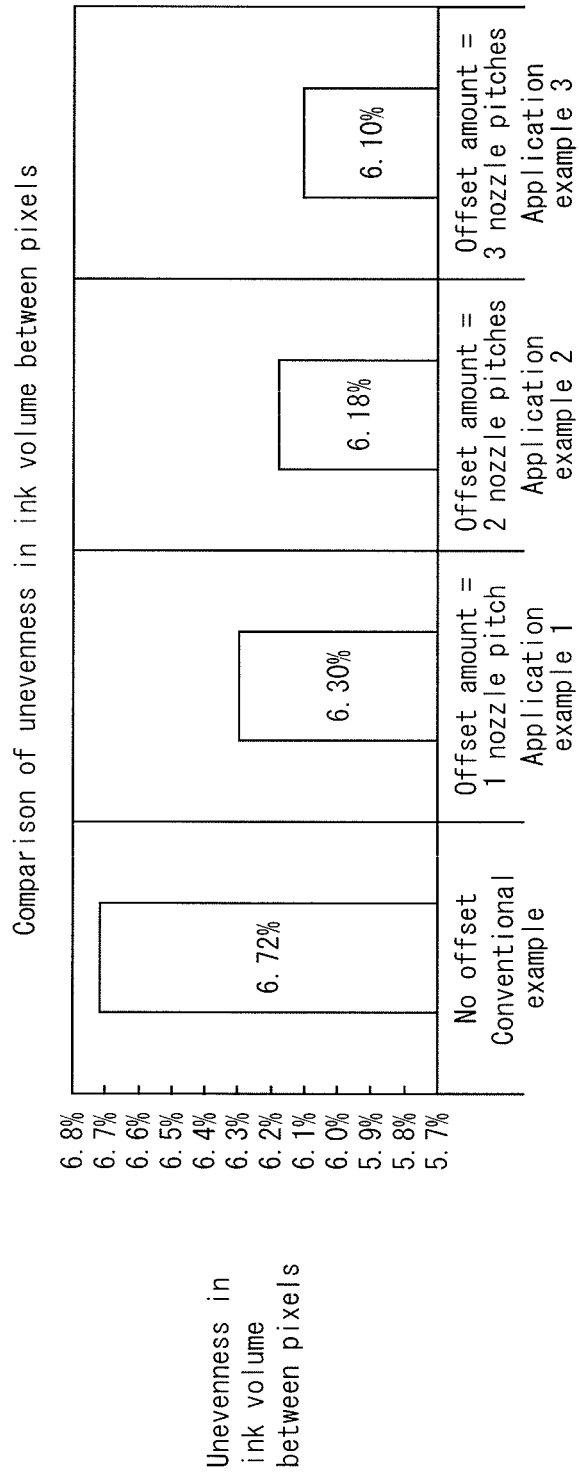
FIG. 14 is a graph illustrating the results of the experiments for confirming the effects of the configuration pertaining to embodiment 1. In specific.

FIG. 14 illustrates a result of comparing the four panels described above (the panel of the conventional example and the panels corresponding to application examples 1 through 3), in terms of ink volume unevenness observed between the one hundred pixels formed in the column direction (a value indicating the level of stripe unevennesses appearing). Here, the ink volume unevenness for a given pixel in the column direction indicates the unevenness of ink volumes of the two-hundred openings (corresponding to two-hundred pixels) that belong to the same row as the opening corresponding to the given pixel. More specifically, when using the average ink amount ejected with respect to the two-hundred openings belonging to the same row as the opening corresponding to the given pixel to indicate an ink volume for the given pixel, and using A to represent the average of such ink volumes for the one-hundred pixels in the column direction and B to represent 3σ (where σ denotes a standard deviation), the ink volume unevenness of a given panel is expressed as B/A (%). A greater ink volume unevenness (%) indicates a greater unevenness between the pixels in the column direction, in terms of the amount of ink ejected thereto. Thus, stripe unevennesses are formed at a greater, more undesirable level in a panel with greater ink volume unevenness.

As illustrated in FIG. 14, the ink volume unevenness of the panel in the conventional example was greatest. The present inventors considered this as being since the same group of nozzles is assigned and used to apply ink with respect to all openings in a same row, and thus, an erroneous ink volume is ejected with respect to only an opening at a certain column-direction position, when observing one group of openings in the column direction. The present inventors made an assumption that this resulted in the situation where, when observing a group of openings in the column direction, the unevenness between ink volumes ejected with respect to the openings being relatively great. In contrast, in application examples 1 through 3, different groups of nozzles are assigned and used to apply ink with respect to, among openings in one row, openings belonging to the first column-direction array and openings belonging to the second column-direction array. Thus, the situation is prevented where an erroneous ink volume is ejected with respect to only an opening at a certain column-direction position, when observing one group of openings in the column direction. The present inventors made an assumption that this resulted in a situation where, when observing a group of openings in the column direction, the unevenness between ink volumes ejected with respect to the openings being relatively small compared to the conventional example.

Thus, the advantageous effect of the technology disclosed in embodiment 1 over the conventional example was confirmed.

<Different Variations of Arrangement Pattern of Openings>

In embodiments 2 though 6 in the following, different variations of the arrangement pattern of openings are described, while referring to FIGS. 10B, FIGS. 11A and 11B, and FIGS. 12A and 12B. Note that in each of the above drawings, reference signs are provided in the same way as in FIG. 10A. Further, in the above drawings, the reference signs "B", "C", and "D" indicate mode B, mode C, and mode D, respectively. Here, note that the nozzle group used for the application of ink liquid droplets in each of such modes (modes B, C, D) includes the same number of nozzles as the nozzle group used in mode A (standard mode), and: the nozzle group used in mode B differs from the group of nozzles used in mode A by one nozzle in the column direction; the nozzle group used in mode C differs from the group of nozzles used in mode A by two nozzles in the column direction; and the nozzle group used in mode D differs from the group of nozzles used in mode A by three nozzles in the column direction. Further, in the above drawings, the numbers (0, 1, 2, 3) above the row-direction lines each indicate the number of nozzles switched between the corresponding mode and mode A (hereinafter referred to as a nozzle switch amount).

Embodiment 2

FIG. 10B illustrates an arrangement pattern of openings pertaining to embodiment 2. Specifically, FIG. 10B illustrates an example where, in the application target substrate $100P_1$, openings 13 (openings 13R, 13G, 13B) that are in a same row are arranged in a zig-zag pattern by being offset from one another in sub-pixel units. In this example, a zig-zag pattern ejection process is performed in the organic light-emission layer forming process for each of the light-emission colors R, G, B such that the switching between mode A and mode B is performed each time the head unit 301 moves from one to another one of corresponding ones of the column-direction arrays $L_{R1}$, $L_{G1}$, $L_{B1}$, and so on.

Embodiment 2 achieves the same effects as embodiment 1. Further, the occurrence of stripe unevennesses is prevented to a further extent since each opening (one of openings 13R, 13G, 13B) has a column-direction position differing from that of an adjacent opening (another one of openings 13R, 13G, 13B) in a same row.

Embodiment 3

FIG. 11A illustrates an arrangement pattern of openings pertaining to embodiment 3. Specifically, FIG. 11A illustrates an example where, above the application target substrate $100P_2$, each pair of two pixels that are continuously-adjacent in a same row composes one unit. In each unit, each of the openings 13R, 13G, 13B is adjusted so as to have the same column-direction position in each of the two pixels composing the unit. Further, between two adjacent units, the openings 13 of each of the colors R, G, B in one unit and the openings 13 of the corresponding one of the colors R, G, B in the other unit form a staircase pattern as illustrated in FIG. 11A, by switching between mode A and mode B being performed when the head unit 301 moves from one unit to the other. In this example, a staircase pattern ejection process is performed in the organic light-emission layer forming process for each of the light-emission colors R, G, B such that the switching between mode A and mode B is performed each time the head unit 301 moves from one unit to an adjacent unit.

Embodiment 3 achieves the same effects as embodiment 1. Further, the difference in column-direction positions of openings of the same color (openings 13R, 13G, 13B) in a same row is relatively small in this example. Thus, switching between modes is performed less frequently in this example. Accordingly, the ejection of ink is performed more stably.

Note that although two adjacent pixels compose one unit in the above, the number of pixels composing a unit may be changed. For instance, each unit may include no less than two and no more than one-hundred pixels. Pixels may be disposed in such a manner by adjusting the patterning of the bank layer 7 as necessary.

Embodiment 4

FIG. 11B illustrates an arrangement pattern of openings pertaining to embodiment 4. Specifically, FIG. 11B illustrates an example where, above the application target substrate $100P_3$, the nozzle switch amount is first increased step by step from 0 to 3 and then is decreased to 0 at one stroke. Specifically, the increasing of the nozzle switch amount by one level is performed each time the head unit 301 moves from one pixel to another adjacent pixel in the row direction, and the decreasing of the nozzle switch amount is performed when the head unit 301 moves from one pixel to another adjacent pixel after the nozzle switch amount has been increased to 3. Further, this pattern of first increasing the nozzle switching amount and then decreasing the nozzle switching amount is performed repeatedly, such that in one row, each of the openings 13R, 13G, 13B is arranged in a staircase pattern as illustrated in FIG. 11B. In this example, a staircase pattern ejection process is performed in the organic light-emission layer forming process for each of the light-emission colors R, G, B such that the switching between modes is performed each time the head unit 301 moves from one pixel to another adjacent pixel in the row direction and the modes are switched in the order of mode A, mode B, mode C, and mode D.

Embodiment 4 achieves the same effects as embodiment 1. In addition, in embodiment 4, due to all modes A through D being used by switching, a relatively great number of nozzles is switched during the movement of the head unit 301 (nozzles $n_1$, $n_2$, $n_4$, $n_5$, $n_{10}$, $n_{11}$, $n_{12}$ are switched). Thus, the possibility of a nozzle ejecting an erroneous ink volume being switched is relatively high, and thus, the example in embodiment 4 achieves an excellent effect of preventing the occurrence of stripe unevennesses.

Embodiment 5

FIG. 12A illustrates an arrangement pattern of openings pertaining to embodiment 5. FIG. 12A illustrates an example where, in the application target substrate $100P_4$, each of the openings 13R, 13G, 13B in one pixel is offset with respect to the corresponding one of the openings 13R, 13G, 13B in an adjacent pixel in a same row, and the offsetting of the openings 13R, 13G, 13B is performed in a random pattern. In this example, the nozzle switching amount when the head unit 301 moves from one pixel to another adjacent pixel in a same row changes randomly within the range of 0 to 3. In this example, a random pattern ejection process is performed in the organic light-emission layer forming process for each of the light-emission colors R, G, B such that the mode applied for ink application is switched randomly from one of modes A through D to another one of modes A through D each time the head unit 301 moves from one pixel to another adjacent pixel in a same row. Here, note that the openings 13R, 13G, 13B may be disposed in any random way. Further, in this example, the nozzle shift amount is not limited to changing within the range of 0 to 3. That is, the nozzle shift amount may be 4 or greater. In addition, in this example, the column-direction offset amount between each of openings 13R, 13G, 13B in one pixel and the corresponding one of the openings 13R, 13G, 13B in an adjacent pixel in a same row is to be no smaller than the pitch between ink liquid droplets actually arriving at the application target substrate 100P$_4$ and no greater than 50% of the pitch at which the openings 13 are disposed in the column direction. Further, in this example, the offsetting of openings in a same row is not limited to being performed in units of pixels, and may be performed in units of sub-pixels.

Embodiment 5 achieves the same effects as embodiment 1. In addition, embodiment 5 is similar to embodiment 4 in that, due to all modes A through D being used by switching, a relatively great number of nozzles is switched during the movement of the head unit 301 (nozzles $n_4$, $n_5$, $n_{10}$, $n_{11}$, $n_{12}$ are switched). Thus, the example in embodiment 5 achieves an excellent effect of preventing the occurrence of stripe unevennesses.

Embodiment 6

FIG. 12B illustrates an arrangement pattern of openings pertaining to embodiment 6. Specifically, FIG. 12B illustrates an example where, above the application target substrate 100P$_5$, the nozzle switch amount is first increased step by step from 0 to 3 and then is decreased step by step from 3 to 0. Specifically, the increasing and the decreasing of the nozzle switch amount by one level is performed each time the head unit 301 moves from one pixel to another adjacent pixel in a same row, and the decreasing of the nozzle switch amount is performed by one level is performed each time the head unit 301 moves from one pixel to another adjacent pixel in the same row after the nozzle switch amount has been increased to 3. Further, this pattern of first increasing the nozzle switching amount and then decreasing the nozzle switching amount is performed repeatedly, such that in a same row, each of the openings 13R, 13G, 13B is arranged in a staircase (wave-like) pattern. In this example, a staircase pattern ejection process is performed in the organic light-emission layer forming process for each of the light-emission colors R, G, B such that the switching between modes is performed each time the head unit 301 moves from one pixel to another adjacent pixel in a same row, and the modes are first switched in the order of mode A, mode B, mode C, and mode D before subsequently being switched in the order of mode C, mode B, and mode A.

Embodiment 6 achieves the same effects as embodiment 1. In addition, embodiment 6 is similar to embodiment 4 in that, due to all modes A through D being used by switching, a relatively great number of nozzles is switched during the movement of the head unit 301 (nozzles $n_4$-$n_6$, and $n_{10}$-$n_{12}$ are switched). Thus, the example in embodiment 6 achieves an excellent effect of preventing the occurrence of stripe unevennesses.

OTHER EMBODIMENTS

Embodiment 7

Figure 15:
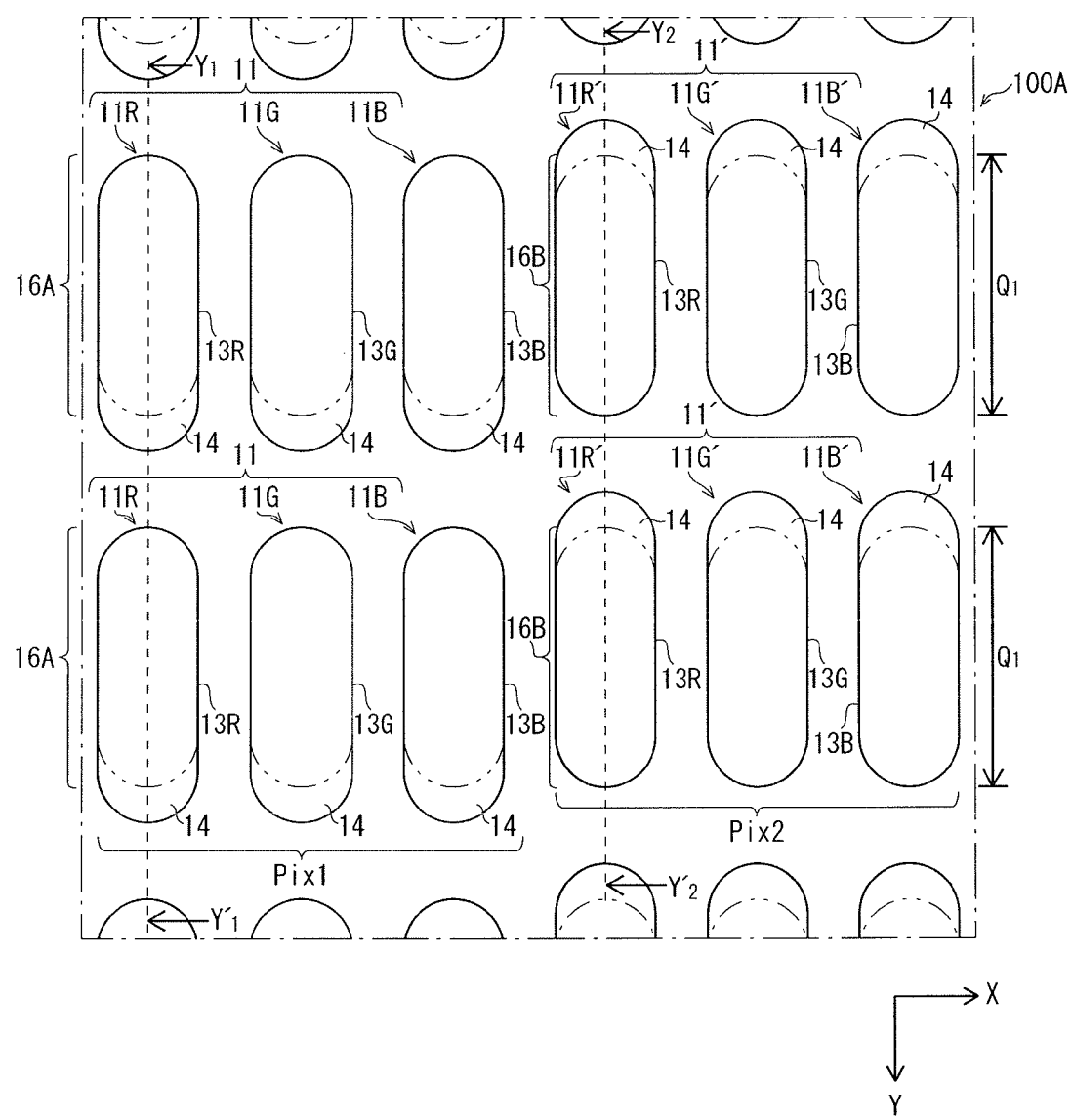
FIG. 15 is a partially-enlarged diagram illustrating the structure of an area including organic EL elements 11, 11' in an organic EL display panel pertaining to embodiment 7.
Figure 16:
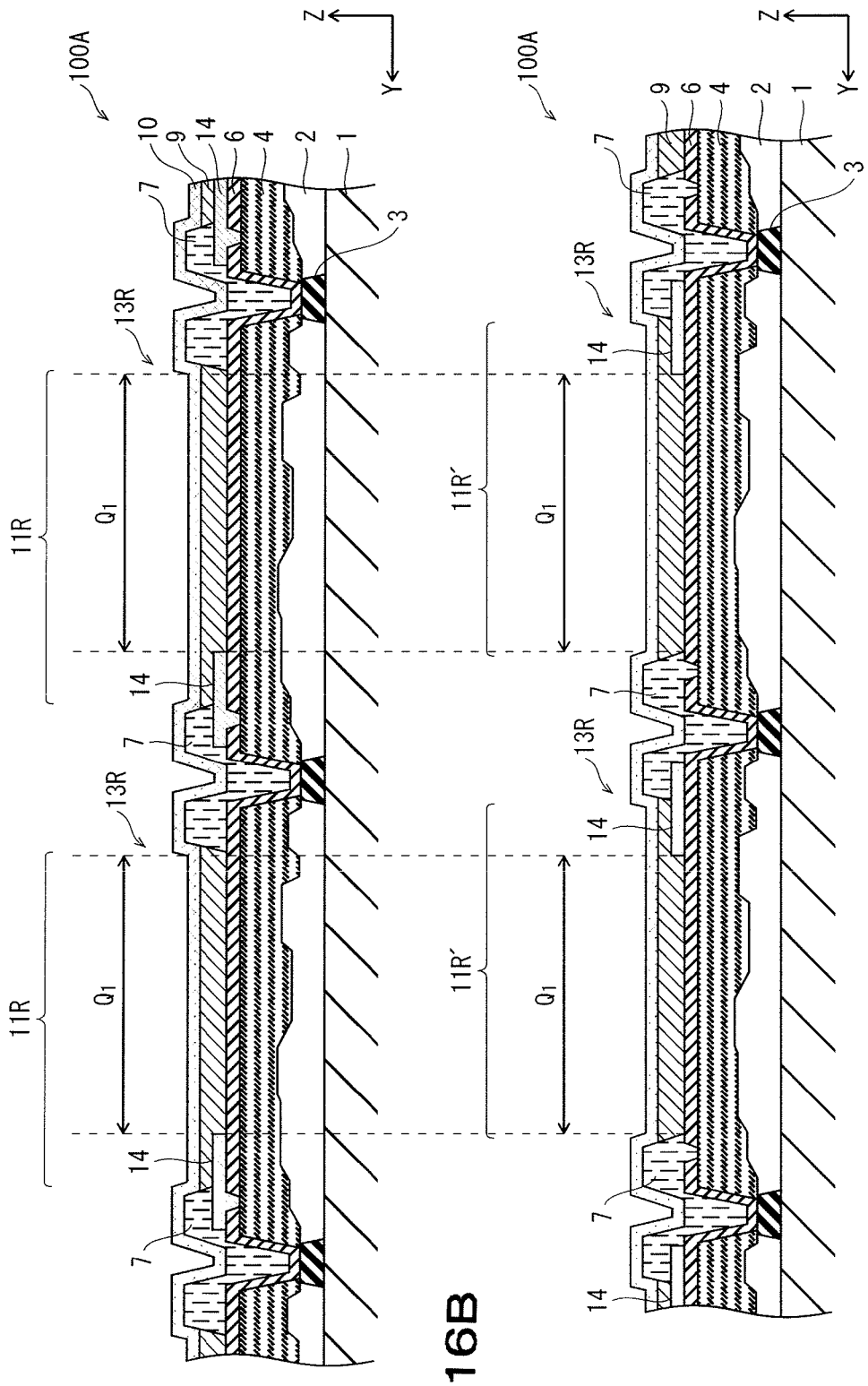
FIG. 16A is a partial cross-sectional diagram illustrating the structure of an area including an organic EL element 11R in the organic EL display panel pertaining to embodiment 7.
FIG. 16B is a partial cross-sectional diagram illustrating the structure of an area including an organic EL element 11R' in the organic EL display panel pertaining to embodiment 7.

FIG. 15 is a partially enlarged diagram schematically illustrating, in an organic EL display panel 100A pertaining to embodiment 7, organic EL elements 11 (organic EL elements 11R, 11G, 11B) of a first pixel Pix$_1$ and organic EL elements 11' (organic EL elements 11R', 11G', 11B') of a second pixel Pix$_2$. The organic EL elements 11 of the first pixel Pix$_1$ are formed with respect to openings that belong to first column-direction arrays for the colors R, G, B, and the organic EL elements 11' of the second pixel Pix$_2$ are formed with respect to openings that belong to second column-direction arrays for the colors R, G, B. Portion (a) of FIG. 16 is a cross-sectional diagram taken along line Y$_1$-Y$_1$' in FIG. 15, specifically illustrating an area including the organic EL element 11R. Portion (b) of FIG. 16 is a cross-sectional diagram taken along line Y$_2$-Y$_2$' in FIG. 15, specifically illustrating an area including the organic EL element 11R'.

The organic EL display panel 100A differs from the organic EL display panel 100 in that in each of the organic EL elements 11 and 11', a pixel defining layer 14 is disposed in each of the openings 13R, 13B, 13G. Specifically, in each of the openings 13R, 13B, 13G, the pixel defining layer 14 is disposed between the first electrode 2 and the organic light-emission layer 9 at one or both of two column-direction end portions of the corresponding opening 13 (FIGS. 15 and 16). Note that in FIG. 15, for each pixel defining layer 14, an outline portion that faces a light-emission region (light-emission regions 16A, 16B) is illustrated by dashed double-dotted lines. The pixel defining layer 14 is made of an organic electrically-insulative material or an inorganic electrically-insulative material. Due to this, in each of the organic EL elements 11 and 11', a region where the pixel defining layer 14 exists becomes a non-light-emission region, while a region where the pixel defining layer 14 does not exist becomes a light-emission region (light-emission region 16A in organic EL element 11, and light-emission region 16B in organic EL element 11'). Further, in FIG. 15, the pixel defining layer 14 is disposed at a region of the organic EL element 11 appearing as a lower region in the drawing, while the pixel defining layer 14 is disposed at a region of the organic EL element 11' appearing as an upper region in the drawing.

Arranging the positions of the pixel defining layers 14 in the first pixel Pix$_1$ and the second pixel Pix$_2$, which are adjacent to each other in the row direction, as illustrated in FIG. 15 has the following effects. First of all, the lengthwise-direction length of the first light-emission regions 16A and the lengthwise-direction length of the second light-emission regions 16B are equalized. Here, as already described above, the first light-emission regions 16A correspond to the organic EL elements 11 (11R, 11G, 11B) in the first pixel Pix$_1$, and the first light-emission regions 16B correspond to the organic EL elements 11' (11R', 11G', 11B') in the second pixel Pix$_2$. Further, the lengthwise direction of the light-emission regions corresponds to the Y direction in FIG. 15, and thus corresponds to the column direction. Secondly, a light-emission region 16A and a light-emission region 16B in a same row are put in alignment with respect to one another in the column direction. Thus, as illustrated by using dotted lines in portions (a) and (b) of FIG. 16, the first light-emission regions 16A in the first pixel Pix$_1$ and the second light-emission regions 16B in the second pixel Pix$_2$, each of which having the same column-direction width Q$_1$, are disposed to form a line in the row direction by being arranged at the same column-direction position. Further, in one row of pixels of the organic EL display panel 100A, the light-emission regions corresponding to all pixels form a line by being put in column-direction alignment with respect to one another, similar as the light-emission regions in the first pixel Pix$_1$ and the second pixel Pix$_2$.

Further, in the example illustrated in FIG. 15, the openings 13R, 13G, 13B are illustrated as each having an outline of an elliptical shape that is elongated in the column direction. As such, the outline portions of the pixel defining layers 14 that are close to the light-emission regions 16A, 16B have shapes that are substantially the same as the shape of the corresponding outline portions of the openings 13R, 13G, 13B. Such a configuration ensures that the light-emission regions 16A and 16B have the same shapes in the entirety of the organic EL display panel 100A, and further, ensures that the organic EL display panel 100A has excellent image display characteristics.

The organic EL display panel 100A pertaining to the present embodiment, which is configured as described above, achieves the same effects as embodiment 1. In addition, according to the present embodiment, even when the openings corresponding to the first pixel $Pix_1$ and the openings corresponding to the second pixel $Pix_2$ are offset with respect to one another in the column direction as described above, the light-emission regions 16A and the light-emission regions 16B maintain column-direction alignment (FIG. 15). As such, due to including the organic EL elements 11 and 11' and thus including the light-emission regions 16A and the light-emission regions 16B, which are in column-direction alignment with one another thus form a line in the row direction, the organic EL display panel 100A achieves excellent image display quality due to having a low level of luminance unevenness.

In the example illustrated by using FIGS. 15 and 16, the pixel defining layer 14 is provided at one of the two column-direction end portions of each of the organic EL elements 11, 11'. Alternatively, the pixel defining layer 14 may be provided at both of the two column-direction end portions of each of the organic EL elements 11, 11'. However, when making such a modification, care is to be taken such that the column-direction size of the light-emission regions 16A, 16B does not become excessively small.

In the following, description is provided on a method of disposing the pixel defining layer 14. After the first electrode 6 is formed (FIG. 2C) and before the organic light-emission layer 9 is formed, a paste including the electrically-insulative organic material or the electrically-insulative inorganic material as described above is applied with respect to a predetermined position in each opening 13, and patterning is performed, according to a photoresist method. Accordingly, the pixel defining layer 14 is formed. Note that preferably, the pixel defining layer 14 is formed before the bank layer 7 is formed.

As a matter of course, when providing the openings 13 with a relatively small size, the luminance that is required for causing the organic EL elements 11, 11' to emit light increases, accordingly. Typically, causing organic EL elements to emit light at high luminance results in a reduction of the operating lifetime. Thus, when determining the size of the openings 13, the balance between operation lifetime of the organic EL elements to be formed and the luminance required for causing the organic EL elements to emit light need to be kept in mind. Regarding this, for example, when the area of an opening in an organic EL element, which corresponds to an effective light-emission area in a pixel, is reduced to 50%, the luminance required per effective light-emission area doubles. In this example, it is estimated that the operation lifetime of the organic EL element decreases to approximately 29% to 33%, based on the luminance acceleration factor (typically within a range of approximately 1.6 through 1.8). However, due to improvements made in the lifetime characteristics of material used in forming light-emission layers, the above-described operation lifetime is acceptable. In other words, it is acceptable to reduce the area of the openings 13 by 50%.

When taking the above-described points and conventional specifications related to organic EL display panels, etc., into consideration, it is plausible to set the column-direction length of the pixel defining layers 14 to shorter than 70% of the column-direction length of the openings 13, for example. In particular, to ensure that the light-emission regions 16A, 16B at least have a required level of luminance, the column-direction length of the pixel defining layers 14 is set to shorter than 40% of the column-direction length of the openings 13, preferably.

In other words, it is acceptable to set the column-direction length of the light-emission regions 16A, 16B to at least 30% of the column-direction length of the openings 13. Preferably, the column-direction length of the light-emission regions 16A, 16B is set to at least 60% of the column-direction length of the openings 13.

Embodiment 8

Figure 17:
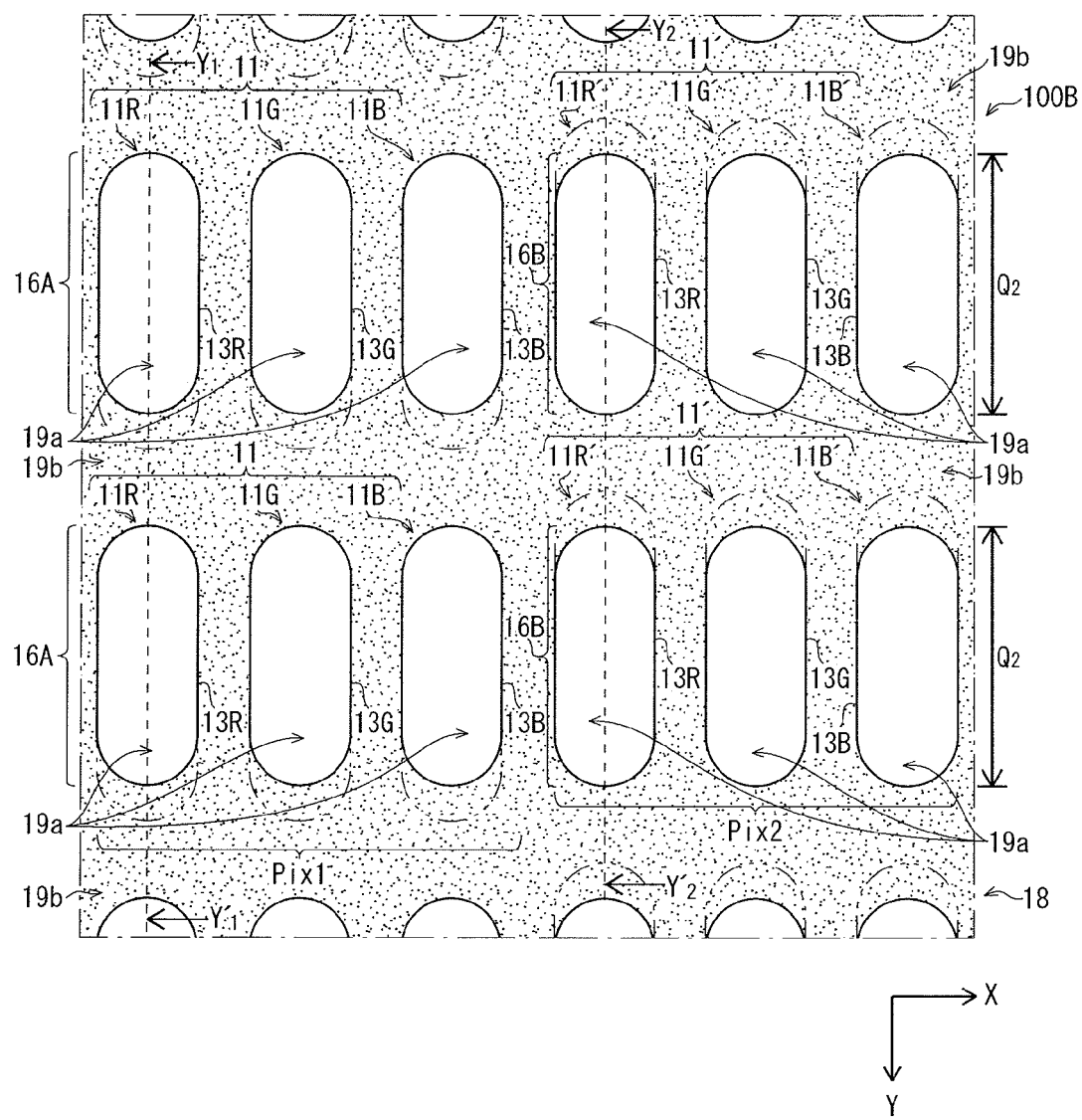
FIG. 17 is a partially-enlarged diagram illustrating the structure of an area including organic EL elements 11 and 11' in an organic EL display panel pertaining to embodiment 8.
Figure 19A:
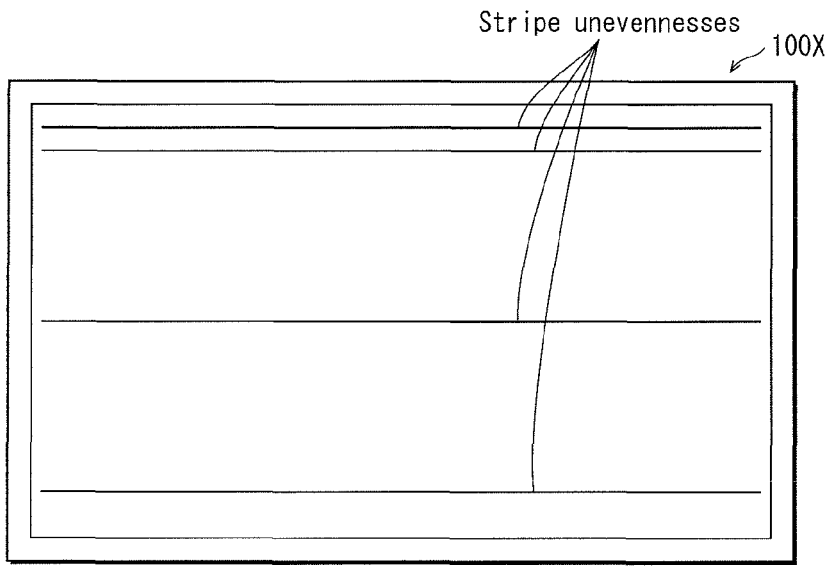
FIGS. 19A through 19C are diagrams for explaining stripe unevennesses appearing in a conventional structure.
Figure 19B:
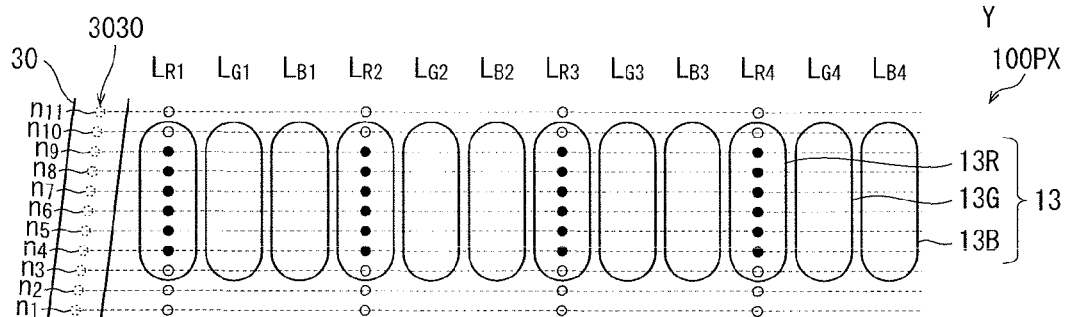
Figure 19C:
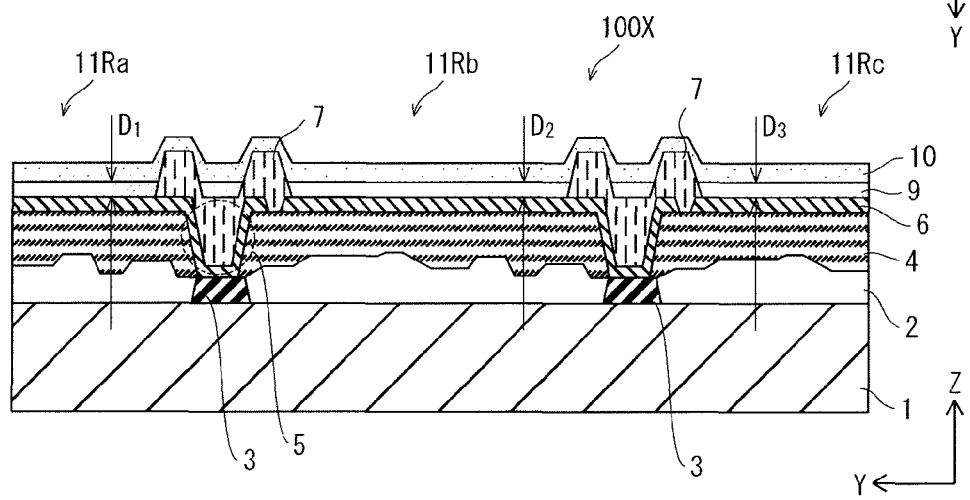

FIG. 17 is a partially enlarged diagram schematically illustrating, in an organic EL display panel 100B pertaining to embodiment 8, organic EL elements 11 (organic EL elements 11R, 11G, 11B) of a first pixel $Pix_1$ and organic EL elements 11' (organic EL elements 11R', 11G', 11B') of a second pixel $Pix_2$. The organic EL elements 11 of the first pixel $Pix_1$ are formed with respect to openings belonging to first column-direction arrays for the colors R, G, B, and the organic EL elements 11' of the second pixel $Pix_2$ are formed with respect to openings belonging to second column-direction arrays for the colors R, G, B. Portion (a) of FIG. 18 is a cross-sectional diagram taken along line $Y_1$-$Y_1'$ in FIG. 17, specifically illustrating an area including the organic EL element 11R. Portion (b) of FIG. 18 is a cross-sectional diagram taken along line $Y_2$-$Y_2'$ in FIG. 17, specifically illustrating an area including the organic EL element 11R'.

The organic EL display panel 100B differs from the organic EL display panel 100 in that a sealing layer 17 is disposed above the second electrode 10, and further, a CF substrate 18 is disposed above the sealing layer 17 (FIG. 18). The CF substrate 19 has light-transmissive areas 19a that are disposed at positions of the CF substrate 19 corresponding one-to-one with the positions of the organic EL elements 11, and a black matrix 19b that has a light-blocking characteristic and that is disposed at positions of the CF substrate 19 other than the positions of the light-transmissive areas 19a (FIG. 17). Due to this, the organic EL elements 11, 11' are surrounded by the black matrix 19b in FIG. 17.

In the organic EL display panel 100B, the light-transmissive areas 19a each have a column-direction width $Q_2$, which is shorter than the column-direction length of the openings 13. Further, in the CF substrate 18, the light-transmissive areas 19a in a same row are disposed in column-direction alignment with one another (FIG. 18). Here, when focusing at each of the organic EL elements 11, 11', one or both of two column-direction end portions of the opening 13 (openings 13R, 13G, 13B) is covered from above by the black matrix 19b. In FIG. 17 for example, the black matrix 19b covers a region of the organic EL element 11 appearing as a lower region in the drawing, and the black matrix 19b covers a region of the organic EL element 11' appearing as an upper region in the drawing. In addition, the outline portions, of the light-transmissive areas 14, defining the light-emission regions 16A, 16B have shapes that are substantially the same as the shape of the corresponding outline portions of the openings 13R, 13G, 13B.

Here, note that the column-direction length of each portion of the black matrix 19b that overlaps a corresponding one of the openings 13R, 13G, 13B is, in specific, similar to the column-direction length of the pixel defining layers 14 in embodiment 7, for example. That is, the column-direction length of such overlapping portions of the black matrix 19b is shorter than 70% of the column-direction length of the openings 13. In particular, to ensure a required level of luminance, the column-direction length of the overlapping portions of the black matrix 19b is set to shorter than 40% of the column-direction length of the openings 13, preferably.

Thus, the column-direction length of the light-emission regions 16A, 16B is set to at least 30% of the column-direction length of the openings 13. Preferably, the column-direction length of the light-emission regions 16A, 16B is set to at least 60% of the column-direction length of the openings 13.

Thus, in front view of the organic EL display panel 100B, the light-emission regions 16A, 16B in a same row, which have the same column-direction width $Q_2$ and the same shape, are disposed in column-direction alignment with one another to form a line in the row direction, similar as in the organic EL display panel 100A pertaining to embodiment 7.

In the organic EL display panel 100B pertaining to the present embodiment, which is configured as described above, the organic EL elements 11 and 11' respectively include the light-emission regions 16A and 16B, which are defined by the light-transmissive areas 19a and the black matrix 19b and which form a line in the row direction by being disposed in column-direction alignment with one another. As such, the organic EL display panel 100B pertaining to the present embodiment achieves substantially the same effects as the organic EL display panel 100A pertaining to embodiment 7.

Note that the organic EL display panel 100B may be manufactured by separately preparing the substrate 1 and the CF substrate 18. As such, the implementation of the organic EL display panel 100B is relatively easy, due to an organic EL display panel 100 already having been manufactured being usable therefor, for example. The organic EL display panel 100B is also advantageous in this sense.

<Other Matters>

In the embodiments, description is provided of using the inkjet table 20, which is a gantry work table. However, the present disclosure is not limited in this way. For example, ink application may be performed by (i) fixing the inkjet head 30, (ii) placing an application target substrate on an XY table, and (iii) moving the application target substrate relatively with respect to the inkjet head 30.

INDUSTRIAL APPLICABILITY

The present disclosure is applicable to organic EL elements, which are typically used in display devices such as mobile phone displays and televisions and in various types of light sources. The present invention is also applicable to an organic EL display panel including such organic EL elements, and a method of manufacturing such an organic EL display panel. Regardless of the specific use thereof, the organic EL elements achieve excellent light-emission characteristics and the organic EL display panel achieves excellent image display quality, due to unevenness in luminance being reduced.

REFERENCE SIGNS LIST $n_1$-$n_{22}$ nozzles
$Pix_1$ first pixel
$Pix_2$ second pixel
1 substrate
2 TFT layer
3 power supply electrode
4 planarizing film
5 contact hole
6 first electrode (anode)
7 bank layer
8 ink liquid droplet
9 organic light-emission layer
10 second electrode (cathode)
11, 11Ra-11Rc, 11R, 11G, 11B, 11R', 11G', 11B' organic EL elements (sub-pixels)
12, 12' concave portions
13, 13R, 13G, 13B openings (areas where organic EL elements are to be formed)
14 pixel defining layer
15 control device
16A, 16B light-emission regions
17 sealing layer
18 CF substrate
19a light-transmissive area
19b black matrix
20 inkjet table
30 inkjet head
100, 100A, 100B organic EL display panels
100P, $100P_1$-$100P_5$, 100PX application target substrates
150 CPU
151 storage unit (memory)
152 display unit (display)
200 base table
206, 300 control unit
210 gantry
220 moveable body
301 head unit
302 main unit
303 servo motor
304a-304e ink ejection mechanism units
1000 inkjet device system
3010, 3010a-3010e piezoelectric elements
3020, 3020a-3020e ink containers
3030, 3030b-3030d nozzles
3050 frame part
3060 ink flow path
3070 barrier wall

The invention claimed is:

1. A method of manufacturing an organic EL display panel, the method comprising:
    forming, above a substrate, a plurality of first electrodes in both a row direction and a column direction of a surface of the substrate;
    forming, above the substrate, a bank layer having openings that are in one-to-one correspondence with the first electrodes, the openings each exposing at least a part of a corresponding one of the first electrodes;
    forming organic light-emission layers by using an inkjet head having a plurality of nozzles, by (i) moving at least one of the inkjet head and the substrate in the row direction and thereby causing relative movement of the inkjet head and the substrate with respect to one another, and (ii) when each of the nozzles arrives above one of the openings as a result of the relative movement, causing said each of the nozzles to eject an ink liquid droplet with respect to said one of the openings so that the ink liquid droplet arrives inside said one of the openings; and
    forming a second electrode above the organic light-emission layers, wherein the bank layer is formed such that, among the openings, a first column-direction array of openings and a second column-direction array of openings are offset with respect to one another in the column direction by an offset amount that is no greater than 50% of a predetermined pitch at which the openings are disposed in the column direction, and the organic light-emission layers are formed by using some of the nozzles as a first group of nozzles and using some of the nozzles as a second group of nozzles, and by switching between the first group of nozzles and the second group of nozzles, the first group of nozzles used when the inkjet head arrives above the first column-direction array of openings and ejecting ink liquid droplets with respect to the first column-direction array of openings, the second group of nozzles used when the inkjet head arrives above the second column-direction array of openings and ejecting ink liquid droplets with respect to the second column-direction array of openings.

2. The method of claim 1, wherein
the offset amount is no smaller than 10% of the predetermined pitch.

3. The method of claim 1, wherein
the forming of the organic light-emission layers is performed for each of three light-emission colors, wherein (i) an ink liquid droplet of a corresponding one of the three light-emission colors is ejected inside a different one of openings that are adjacent in the row direction, whereby a first organic light-emission layer, a second organic light-emission layer, and a third organic light-emission layer, each having a different one of the three light-emission colors, are formed, and (ii) one of the first, second, and third organic light-emission layers is formed with respect to each opening belonging to the first column-direction array of openings, and the same one of the first, second, and third organic light-emission layers is formed with respect to each opening belonging to the second column-direction array of openings.

4. The method of claim 3, wherein
the first organic light-emission layer, the second organic light-emission layer, and the third organic light-emission layer are farmed in the stated order with respect to a set of three openings adjacent in the row direction, and
the bank layer is formed such that (i) the first column-direction array of openings and the second column-direction array of openings are formed for each of the first, second, and third organic light-emission layers, and (ii) the three openings composing the set of three openings, with respect to which the first, second, and third organic light-emission layers are to be formed in the stated order, are not offset in the column direction and thus in alignment with respect to one another in the column direction.

5. The method of claim 4, wherein
the bank layer is formed such that the set of three openings is disposed in plurality in the row direction and such that the bank layer has, in the row direction, a unit composed of no smaller than two and no greater than one hundred continuously-adjacent sets of three openings.

6. The method of claim 1, wherein
the bank layer is formed such that, in the row direction, the first column-direction array of openings and the second column-direction array of openings are adjacent to each other.

7. The method of claim 1, wherein
the bank layer is formed such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a zigzag pattern.

8. The method of claim 1, wherein
the bank layer is formed such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a staircase pattern.

9. The method of claim 1, wherein
the bank layer is formed such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a random pattern.

10. The method of claim 1, wherein
in each of the first group of nozzles and the second group of nozzles, the number of nozzles corresponding to a single opening is no greater than ten.

11. The method of claim 1, wherein
in the inkjet head, the nozzles are disposed along one direction in line, and
the organic light-emission layers are formed by causing said at least one of the inkjet head and the substrate to move in the row direction while forming an angle between said one direction and the row direction.

12. The method of claim 1 further comprising:
forming a pixel defining layer that is made of an electrically-insulative material in each of the openings, the forming of the pixel defining layers performed at least before the forming of the organic light-emission layers, wherein
in each of the openings,
the pixel defining layer partially overlaps with a corresponding one of the first electrodes so as to define a light-emission region of said each of the openings, and
the pixel defining layer is formed at one or both of two column-direction end portions of said each of the openings,
the pixel defining layer is either (i) a first pixel defining layer formed in each opening belonging to the first column-direction array of openings and defining a first light-emission region, which is a light-emission region in said each opening belonging to the first column-direction array of openings, or (ii) a second pixel defining layer formed in each opening belonging to the second column-direction array of openings and defining a second light-emission region, which is a light-emission region in said each opening belonging to the second column-direction array of openings, and
the pixel defining layer is formed such that a first light-emission region and a second light-emission region in a same row have a same column-direction position.

13. The method of claim 12, wherein
the pixel defining layer is formed such that, in the column direction, each of a length of the first light-emission region and a length of the second light-emission region is no shorter than 30% of a length of each of the openings.

14. The method of claim 1 further comprising:
forming a sealing layer above the second electrode; and
disposing a second substrate above the sealing layer, wherein
the second substrate has light-transmissive areas that face the openings in one-to-one correspondence, and a black matrix surrounding the light-transmissive areas,
the light-transmissive areas include: (i) first light-transmissive areas each facing one opening belonging to the first column-direction array of openings and defining a first light-emission region, which is a light-emission region corresponding to said one opening belonging to the first column-direction array of openings, and (ii) second light-transmissive areas each facing one opening belonging to the second column-direction array of openings and defining a second light-emission region, which is a light-emission region corresponding to said one opening belonging to the second column-direction array of openings, and
the light-transmissive areas are disposed such that a first light-emission region and a second light-emission region in a same row have a same column-direction position.

15. The method of claim 14, wherein
the light-transmissive areas are disposed such that, in the column direction, each of a length of the first light-emission region and a length of the second light-emission region is no shorter than 30% of a length of each of the openings.

16. An organic EL display panel comprising:
a substrate;
a TFT layer disposed above the substrate;
a plurality of first electrodes disposed above the TFT layer in both a row direction and a column direction;
a bank layer having a plurality of openings formed therein in both the row direction and the column direction, the openings each exposing a corresponding one of the first electrodes;
a plurality of organic light-emission layers each disposed inside a corresponding one of the openings; and
a second electrode disposed above the organic light-emission layers, wherein
the openings include a first column-direction array of openings and a second column-direction array of openings, the first-column direction array of openings and the second column-direction array of openings being offset with respect to one another in the column direction by an offset amount that is no greater than 50% of a predetermined pitch at which the openings are disposed in the column direction.

17. The organic EL display panel of claim 16, wherein
the offset amount is no smaller than 10% of the predetermined pitch.

18. The organic EL display panel of claim 16, wherein
a first organic light-emission layer, a second organic light-emission layer, and a third organic light-emission layer, each having a different one of three light-emission colors, are formed with respect to openings that are adjacent in the row direction, the forming of each of the first, second, and third organic light-emission layers being performed by ejecting an ink liquid droplet of a corresponding one of the three light-emission colors inside a different one of the openings that are adjacent in the row direction, and one of the first, second, and third organic light-emission layers is formed with respect to each opening belonging to the first column-direction array of openings, and the same one of the first, second, and third organic light-emission layers is formed with respect to each opening belonging to the second column-direction array of openings.

19. The organic EL display panel of claim 18, wherein
the first organic light-emission layer, the second organic light-emission layer, and the third organic light-emission layer are formed in the stated order with respect to a set of three openings adjacent in the row direction, and
in the bank layer, (i) the first column-direction array of openings and the second column-direction array of openings are disposed for each of the first, second, and third organic light-emission layers, and (ii) the three openings composing the set of three openings, with respect to which the first, second, and third organic light-emission layers are to be disposed in the stated order, are not offset in the column direction and thus in alignment with respect to one another in the column direction.

20. The organic EL display panel of claim 19, wherein
the bank layer is such that the set of three openings is disposed in plurality in the row direction, and the bank layer has, in the row direction, a unit composed of no smaller than two and no greater than one hundred continuously-adjacent sets of three openings.

21. The organic EL display panel of claim 16, wherein
the bank layer is such that, in the row direction, the first column-direction array of openings and the second column-direction array of openings are adjacent to each other.

22. The organic EL display panel of claim 16, wherein
the bank layer is such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a zigzag pattern.

23. The organic EL display panel of claim 16, wherein
the bank layer is such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a staircase pattern.

24. The organic EL display panel of claim 16, wherein
the bank layer is such that, in the row direction, the first column-direction array of openings and the second column-direction array of openings exist repeatedly and such that, in each row of openings, openings belonging to the first column-direction arrays of openings and openings belonging to the second column-direction arrays of openings are offset with respect to one another to form a random pattern.

25. The organic EL display panel of claim 16 further comprising:
a pixel defining layer disposed in each of the openings such that in said each of the openings, the pixel defining layer partially overlaps with a corresponding one of the first electrodes so as to define a light-emission region of said each of the openings, wherein the pixel defining layer is formed at one or both of two column-direction end portions of said each of the openings, the pixel defining layer is either (i) a first pixel defining layer disposed in each opening belonging to the first column-direction array of openings and defining a first light-emission region, which is a light-emission region in said each opening belonging to the first column-direction array of openings, or (ii) a second pixel defining layer disposed in each opening belonging to the second column-direction array of openings and defining a second light-emission region, which is a light-emission region in said each opening belonging to the second column-direction array of openings, and the pixel defining layer is formed such that a first light-emission region and a second light-emission region in a same row have a same column-direction position.

26. The organic EL display panel of claim 25, wherein
the pixel defining layer is such that, in the column direction, each of a length of the first light-emission region and a length of the second light-emission region is no shorter than 30% of a length of each of the openings.

27. The organic EL display panel of claim 16 further comprising:
a sealing layer disposed above the second electrode; and
a second substrate disposed above the sealing layer, wherein the second substrate has light-transmissive areas that face the openings in one-to-one correspondence, and a black matrix surrounding the light-transmissive areas, the light-transmissive areas include: (i) first light-transmissive areas each facing one opening belonging to the first column-direction array of openings and defining a first light-emission region, which is a light-emission region corresponding to said one opening belonging to the first column-direction array of openings, and (ii) second light-transmissive areas each facing one opening belonging to the second column-direction array of openings and defining a second light-emission region, which is a light-emission region corresponding to said one opening belonging to the second column-direction array of openings, and the light-transmissive areas are disposed such that a first light-emission region and a second light-emission region in a same row have a same column-direction position.

28. The organic EL display panel of claim 27, wherein
the light-transmissive areas are disposed such that, in the column direction, each of a length of the first light-emission region and a length of the second light-emission region is no shorter than 30% of a length of each of the openings.

* * * * *